US 12,008,960 B2

(12) United States Patent
Liu et al.

(10) Patent No.: US 12,008,960 B2
(45) Date of Patent: Jun. 11, 2024

(54) PIXEL DRIVING CIRCUIT AND METHOD FOR DRIVING THE SAME, AND DISPLAY SUBSTRATE

(71) Applicant: BOE TECHNOLOGY GROUP CO., LTD., Beijing (CN)

(72) Inventors: Weixing Liu, Beijing (CN); Kuanjun Peng, Beijing (CN); Bin Qin, Beijing (CN); Xue Dong, Beijing (CN); Fangzhen Zhang, Beijing (CN); Wanpeng Teng, Beijing (CN); Tieshi Wang, Beijing (CN); Wanzhi Chen, Beijing (CN); Kai Guo, Beijing (CN); Chunfang Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/014,254

(22) PCT Filed: Nov. 22, 2021

(86) PCT No.: PCT/CN2021/132151
§ 371 (c)(1),
(2) Date: Jan. 3, 2023

(87) PCT Pub. No.: WO2022/252508
PCT Pub. Date: Dec. 8, 2022

(65) Prior Publication Data
US 2023/0274696 A1  Aug. 31, 2023

(30) Foreign Application Priority Data
May 31, 2021 (CN) .......................... 202110605113.4

(51) Int. Cl.
*G09G 3/3233* (2016.01)
*H01L 27/15* (2006.01)
(Continued)

(52) U.S. Cl.
CPC ......... *G09G 3/3233* (2013.01); *H01L 27/156* (2013.01); *H01L 33/06* (2013.01);
(Continued)

(58) Field of Classification Search
CPC ..................... G09G 2300/0804; G09G 3/3233
See application file for complete search history.

(56) References Cited

U.S. PATENT DOCUMENTS 10,021,762 B1 * 7/2018 Tsai ..................... H10K 77/111
11,710,445 B2 * 7/2023 He ........................ G09G 3/2014
345/691

(Continued)

FOREIGN PATENT DOCUMENTS

| CN | 103000132 A | 3/2013 |
| CN | 207097427 U | 3/2018 |
| CN | 111462686 A | 7/2020 |

OTHER PUBLICATIONS

International Search Report (with English translation) and Written Opinion for Application No. PCT/CN2021/132151, dated Mar. 7, 2022, 11 pages.

*Primary Examiner* — William Boddie
*Assistant Examiner* — Bipin Gyawali
(74) *Attorney, Agent, or Firm* — Dority & Manning, PA

(57) ABSTRACT

A pixel driving circuit includes a data writing circuit, a light-emitting control circuit and a light-emitting diode chip. The data writing circuit is electrically connected to a first scanning signal terminal, a data signal terminal and a first node. The light-emitting control circuit is electrically connected to the first node, an enable signal terminal, a first voltage signal terminal and a second node, and is configured to transmit a first voltage signal received at the first voltage signal terminal to the second node. The light-emitting diode chip is electrically connected to the second node and a second voltage signal terminal. The light-emitting diode
(Continued)

chip includes a plurality of light-emitting portions. The light-emitting diode chip is configured to drive the plurality of light-emitting portions to emit light in different periods of time respectively or drive at least two light-emitting portions to emit light in a same period of time.

16 Claims, 12 Drawing Sheets

(51) Int. Cl.
    *H01L 33/06*     (2010.01)
    *H01L 33/38*     (2010.01)

(52) U.S. Cl.
    CPC ..... *H01L 33/38* (2013.01); *G09G 2300/0426* (2013.01); *G09G 2300/0819* (2013.01); *G09G 2300/0842* (2013.01); *G09G 2310/0262* (2013.01); *G09G 2310/08* (2013.01); *G09G 2320/0233* (2013.01)

(56) References Cited

U.S. PATENT DOCUMENTS

| | | |
|---|---|---|
| 2011/0134100 A1 | 6/2011 | Chung et al. |
| 2011/0157133 A1 | 6/2011 | Ogura |
| 2012/0133682 A1 | 5/2012 | Kawano et al. |
| 2015/0116191 A1* | 4/2015 | Qi .................. G09G 3/3233 345/76 |
| 2015/0269886 A1 | 9/2015 | Tan et al. |
| 2016/0125803 A1 | 5/2016 | Qing et al. |
| 2016/0307510 A1 | 10/2016 | Duan et al. |
| 2017/0039934 A1 | 2/2017 | Ma |
| 2017/0039944 A1* | 2/2017 | Ma .................. G09G 3/3258 |
| 2017/0200412 A1* | 7/2017 | Gu .................. G09G 3/3266 |
| 2019/0355301 A1 | 11/2019 | Lee |
| 2021/0335216 A1 | 10/2021 | Nie |
| 2021/0366387 A1 | 11/2021 | Yin |
| 2021/0407408 A1 | 12/2021 | Yang et al. |

* cited by examiner

PIXEL DRIVING CIRCUIT AND METHOD FOR DRIVING THE SAME, AND DISPLAY SUBSTRATE

CROSS-REFERENCE TO RELATED APPLICATIONS

This application is a national phase entry under 35 USC 371 of International Patent Application No. PCT/CN2021/132151, filed on Nov. 22, 2021, which claims priority to Chinese Patent Application No. 202110605113.4, filed on May 31, 2021, which are incorporated herein by reference in their entirety.

TECHNICAL FIELD

The present disclosure relates to the field of display technologies, and in particular, to a pixel driving circuit and a method for driving the same, and a display substrate.

BACKGROUND

Light-emitting diodes (LEDs) are widely used in fields such as traditional displays, near-to-eye displays, three-dimensional (3D) displays and transparent displays due to their advantages such as high efficiency, high brightness, high reliability, energy saving and fast response.

SUMMARY

In an aspect, a pixel driving circuit is provided. The pixel driving circuit includes a data writing circuit, a light-emitting control circuit and a light-emitting diode chip. The data writing circuit is electrically connected to a first scanning signal terminal, a data signal terminal and a first node. The data writing circuit is configured to transmit a data signal received at the data signal terminal to the first node in response to a first scanning signal received at the first scanning signal terminal. The light-emitting control circuit is electrically connected to the first node, an enable signal terminal, a first voltage signal terminal and a second node. The light-emitting control circuit is configured to transmit a first voltage signal received at the first voltage signal terminal to the second node under control of a voltage of the first node and an enable signal transmitted by the enable signal terminal. The light-emitting diode chip is electrically connected to the second node and a second voltage signal terminal. The light-emitting diode chip includes a plurality of light-emitting portions. The light-emitting diode chip is configured to, with cooperation of the first voltage signal from the second node and a second voltage signal received at the second voltage signal terminal, drive the plurality of light-emitting portions to emit light in different periods of time respectively or drive at least two light-emitting portions in the plurality of light-emitting portions to emit light in a same period of time.

In some embodiments, the plurality of light-emitting portions include at least one first light-emitting portion and at least one second light-emitting portion. A first bonding electrode of a first light-emitting portion in the at least one first light-emitting portion is electrically connected to the second node, and a second bonding electrode of the first light-emitting portion is electrically connected to the second voltage signal terminal. A first bonding electrode of a second light-emitting portion in the at least one second light-emitting portion is electrically connected to the second voltage signal terminal, and a second bonding electrode of the second light-emitting portion is electrically connected to the second node.

In some embodiments, the light-emitting control circuit includes a first transistor and a second transistor. A control electrode of the first transistor is electrically connected to the enable signal terminal; a first electrode of the first transistor is electrically connected to the first voltage signal terminal, and a second electrode of the first transistor is electrically connected to a third node. A control electrode of the second transistor is electrically connected to the first node, a first electrode of the second transistor is electrically connected to the third node, and a second electrode of the second transistor is electrically connected to the second node.

In some embodiments, the pixel driving circuit further includes a first reset compensation circuit. The first reset compensation circuit is electrically connected to the first scanning signal terminal, a second scanning signal terminal, the first node, the second node; the third node and the second voltage signal terminal; and the first reset compensation circuit is configured to, under control of the first scanning signal and a second scanning signal received at the second scanning signal terminal, reset the pixel driving circuit and compensate for a threshold voltage of the second transistor.

In some embodiments, the first reset compensation circuit includes a third transistor, a fourth transistor, a fifth transistor, a sixth transistor and a first capacitor. A control electrode of the third transistor is electrically connected to the first scanning signal terminal, a first electrode of the third transistor is electrically connected to the second voltage signal terminal, and a second electrode of the third transistor is electrically connected to a fourth node. A control electrode of the fourth transistor is electrically connected to the second scanning signal terminal, a first electrode of the fourth transistor is electrically connected to the third node, and a second electrode of the fourth transistor is electrically connected to a fifth node. A control electrode of the fifth transistor is electrically connected to the second scanning signal terminal, a first electrode of the fifth transistor is electrically connected to the second node, and a second electrode of the fifth transistor is electrically connected to the fifth node. A control electrode of the sixth transistor is electrically connected to the first scanning signal terminal, a first electrode of the sixth transistor is electrically connected to the fourth node, and a second electrode of the sixth transistor is electrically connected to the first node. A first terminal of the first capacitor is electrically connected to the fourth node, and a second terminal of the first capacitor is electrically connected to the fifth node.

In some embodiments, the pixel driving circuit further includes a plurality of switching transistors. A first bonding electrode of a light-emitting portion in the plurality of light-emitting portions is electrically connected to the second node through at least one switching transistor in the plurality of switching transistors; and/or a second bonding electrode of the light-emitting portion is electrically connected to the second voltage signal terminal through at least one other switching transistor in the plurality of switching transistors.

In some embodiments, a number of the plurality of light-emitting portions is equal to a number of the plurality of switching transistors. The first bonding electrode of the light-emitting portion is electrically connected to the second node directly, and the second bonding electrode of the light-emitting portion is electrically connected to the second voltage signal terminal through one switching transistor.

In some embodiments, a number of the plurality of light-emitting portions is less than a number of the plurality of switching transistors. A first bonding electrode of one light-emitting portion in the plurality of light-emitting portions is electrically connected to the second node directly, and is electrically connected to a first bonding electrode of another light-emitting portion in the plurality of light-emitting portions through at least one switching transistor in the plurality of switching transistors. A second bonding electrode of the one light-emitting portion in the plurality of light-emitting portions is electrically connected to the second voltage signal terminal through at least one other switching transistor in the plurality of switching transistors, and is electrically connected to the first bonding electrode of the another light-emitting portion through at least one yet other switching transistor in the plurality of switching transistors. A second bonding electrode of the another light-emitting portion is electrically connected to the second voltage signal terminal directly.

In some embodiments, the light-emitting control circuit includes a seventh transistor and an eighth transistor. A control electrode of the seventh transistor is electrically connected to the first node, a first electrode of the seventh transistor is electrically connected to the first voltage signal terminal, and a second electrode of the seventh transistor is electrically connected to a sixth node. A control electrode of the eighth transistor is electrically connected to the enable signal terminal, a first electrode of the eighth transistor is electrically connected to the sixth node, and a second electrode of the eighth transistor is electrically connected to the second node.

In some embodiments, the pixel driving circuit further includes a second reset compensation circuit. The second reset compensation circuit is electrically connected to the first scanning signal terminal, the first node and the sixth node; and the second reset compensation circuit is configured to compensate for a threshold voltage of the seventh transistor in response to the first scanning signal. The second reset compensation circuit is further electrically connected to an initial signal terminal, and at least one of a third scanning signal terminal and a fourth scanning signal terminal; and the second reset compensation circuit is further configured to, in response to a third scanning signal received at the third scanning signal terminal or a fourth scanning signal received at the fourth scanning signal terminal, transmit an initial signal received at the initial signal terminal to the first node, so as to reset the first node.

In some embodiments, the second reset compensation circuit includes an eleventh transistor and a second capacitor. A control electrode of the eleventh transistor is electrically connected to the first scanning signal terminal, a first electrode of the eleventh transistor is electrically connected to a seventh node, and a second electrode of the eleventh transistor is electrically connected to the sixth node. A first terminal of the second capacitor is electrically connected to the first node, and a second terminal of the second capacitor is electrically connected to the seventh node. The control electrode of the seventh transistor is electrically connected to the first node through the second capacitor. In a case where the second reset compensation circuit is electrically connected to the third scanning signal terminal, the second reset compensation circuit further includes a ninth transistor. A control electrode of the ninth transistor is electrically connected to the third scanning signal terminal, a first electrode of the ninth transistor is electrically connected to the initial signal terminal, and a second electrode of the ninth transistor is electrically connected to the first node. In a case where the second reset compensation circuit is electrically connected to the fourth scanning signal terminal, the second reset compensation circuit further includes a tenth transistor. A control electrode of the tenth transistor is electrically connected to the fourth scanning signal terminal, a first electrode of the tenth transistor is electrically connected to the initial signal terminal, and a second electrode of the tenth transistor is electrically connected to the first node.

In some embodiments, the data writing circuit includes a twelfth transistor. A control electrode of the twelfth transistor is electrically connected to the first scanning signal terminal, a first electrode of the twelfth transistor is electrically connected to the data signal terminal, and a second electrode of the twelfth transistor is electrically connected to the first node.

In another aspect, a method for driving the pixel driving circuit as described in any of the above embodiments is provided. The method includes a data writing phase and a light-emitting phase. In the data writing phase, in response to the first scanning signal received at the first scanning signal terminal, the data writing circuit is turned on to transmit the data signal received at the data signal terminal to the first node. In the light-emitting phase, under the control of the voltage of the first node and the enable signal received at the enable signal terminal, the light-emitting control circuit is turned on to transmit the first voltage signal received at the first voltage signal terminal to the second node; and with the cooperation of the first voltage signal from the second node and the second voltage signal received at the second voltage signal terminal, the plurality of light-emitting portions in the light-emitting diode chip emit light in the different periods of time, or the at least two light-emitting portions emit light in the same period of time.

In yet another aspect, a display substrate is provided. The display substrate includes a substrate; and a plurality of pixel driving circuits each as described in any of the above embodiments. The plurality of pixel driving circuits are disposed on a side of the substrate. In the plurality of light-emitting portions included in the light-emitting diode chip in the pixel driving circuit, each light-emitting portion includes a first semiconductor layer, a quantum well layer and a second semiconductor layer that are stacked in sequence; the first semiconductor layer and the second semiconductor layer have different doping types. The light-emitting portion further includes at least one of a first bonding electrode and a second bonding electrode. The first bonding electrode is electrically connected to the first semiconductor layer of the light-emitting portion. The second bonding electrode is electrically connected to the second semiconductor layer of the light-emitting portion.

In some embodiments, the light-emitting diode chip further includes a base. The plurality of light-emitting portions included in the light-emitting diode chip are located on a same side of the base.

In some embodiments, the light-emitting portion includes the first bonding electrode and the second bonding electrode. First bonding electrodes included in different light-emitting portions are different, and second bonding electrodes included in different light-emitting portions are different.

In some embodiments, the light-emitting portion includes a plurality of light-emitting sub-portions arranged in series. Each light-emitting sub-portion includes a first semiconductor sub-layer, a first quantum well sub-layer and a second semiconductor sub-layer that are stacked in sequence. A first semiconductor sub-layer of a light-emitting sub-portion in a same light-emitting portion is electrically connected to the first bonding electrode of the same light-emitting portion. A second semiconductor sub-layer of another light-emitting sub-portion in the same light-emitting portion is electrically connected to the second bonding electrode of the same light-emitting portion.

In some embodiments, in a case where the plurality of light-emitting portions include at least one first light-emitting portion and at least one second light-emitting portion, a first semiconductor layer of the first light-emitting portion and a second semiconductor layer of the second light-emitting portion are electrically connected to a second bonding electrode; and a second semiconductor layer of the first light-emitting portion and a first semiconductor layer of the second light-emitting portion are electrically connected to another second bonding electrode.

In some embodiments, the light-emitting diode chip further includes a plurality of connection portions. The first semiconductor layer of the first light-emitting portion is electrically connected to the second semiconductor layer of the second light-emitting portion through a connection portion in the plurality of connection portions. The first semiconductor layer of the second light-emitting portion is electrically connected to the second semiconductor layer of the first light-emitting portion through another connection portion in the plurality of connection portions.

In some embodiments, the first light-emitting portion includes a plurality of first light-emitting sub-portions arranged in series, and the second light-emitting portion includes a plurality of second light-emitting sub-portions arranged in series. Each first light-emitting sub-portion includes a third semiconductor sub-layer, a second quantum well sub-layer and a fourth semiconductor sub-layer that are stacked in sequence; and each second light-emitting sub-portion includes a fifth semiconductor sub-layer, a third quantum well sub-layer and a sixth semiconductor sub-layer that are stacked in sequence. A third semiconductor sub-layer of a first light-emitting sub-portion in the plurality of first light-emitting sub-portions is electrically connected to the second bonding electrode, and is electrically connected to a sixth semiconductor sub-layer of a second light-emitting sub-portion in the plurality of second light-emitting sub-portions. A fifth semiconductor sub-layer of another second light-emitting sub-portion in the plurality of second light-emitting sub-portions is electrically connected to the another second bonding electrode, and is electrically connected to a fourth semiconductor sub-layer of another first light-emitting sub-portion in the plurality of first light-emitting sub-portions.

In some embodiments, first semiconductor layers of at least two light-emitting portions are of a one-piece structure and are electrically connected to a same first bonding electrode.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings in the following description may be regarded as schematic diagrams, and are not limitations on actual sizes of products, actual processes of methods and actual timings of signals involved in the embodiments of the present disclosure.

DETAILED DESCRIPTION

Figure 1:
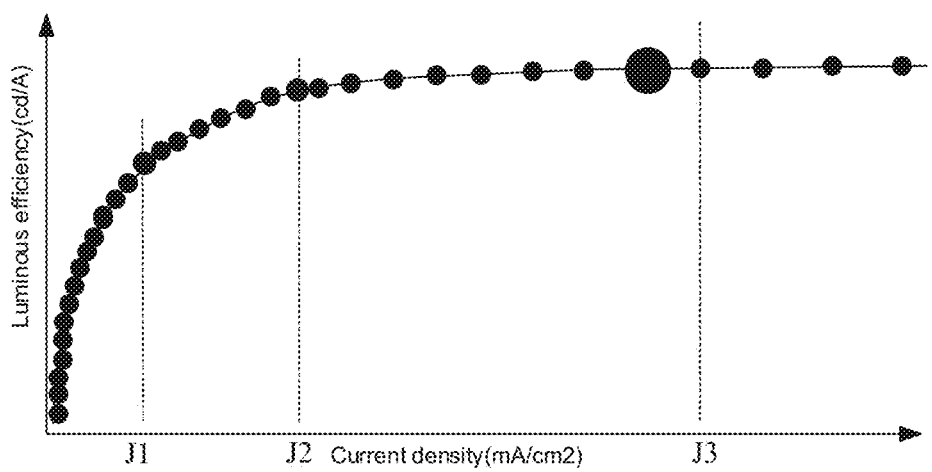
FIG. 1 is a diagram illustrating a relationship between a current density and a luminous efficiency of an LED, in accordance with an implementation.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed in an open and inclusive meaning, i.e., "including, but not limited to". In the description of the specification, the terms such as "one embodiment", "some embodiments", "exemplary embodiments", "example", "specific example" and "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first and second" are used for descriptive purposes only, and are not to be construed as indicating or implying the relative importance or implicitly indicating the quantity of indicated technical features. Thus, a feature defined with "first" or "second" may explicitly or implicitly includes one or more of the features. In the description of the embodiments of the present disclosure, the terms "a plurality of", "the plurality of" and "multiple" each mean two or more unless otherwise specified.

In the description of some embodiments, the term "connected" and derivatives thereof may be used. For example, the term "connected" may be used in the description of some embodiments to indicate that two or more components are in direct physical or electrical contact with each other. The embodiments disclosed herein are not necessarily limited to the content herein.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, depending on the context, the term "if" is optionally construed as "when", "in a case where", "in response to determining" or "in response to detecting". Similarly, depending on the context, the phrase "if it is determined" or "if [a stated condition or event] is detected" is optionally construed as "in a case where it is determined", "in response to determining", "in a case where [the stated condition or event] is detected", or "in response to detecting [the stated condition or event]".

The phrase "applicable to" or "configured to" used herein means an open and inclusive expression, which does not exclude devices that are applicable to or configured to perform additional tasks or steps.

In addition, the phrase "based on" used is meant to be open and inclusive, since a process, step, calculation or other action that is "based on" one or more of the stated conditions or values may, in practice, be based on additional conditions or values exceeding those stated.

As used herein, the terms such as "about" or "approximately" include a stated value and an average value within an acceptable range of deviation of a particular value. The acceptable range of deviation is determined by a person of ordinary skill in the art, in view of the measurement in question and errors associated with the measurement of a particular quantity (i.e., the limitations of the measurement system).

Exemplary embodiments are described herein with reference to sectional views and/or plan views as idealized exemplary drawings. In the accompanying drawings, thicknesses of layers and sizes of regions are enlarged for clarity. Variations in shapes relative to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown to have a rectangular shape generally has a feature of being curved. Therefore, the regions shown in the accompanying drawings are schematic in nature, and their shapes are not intended to show actual shapes of regions in a device, and are not intended to limit the scope of the exemplary embodiments.

Transistors in circuits provided in embodiments of the present disclosure may be thin film transistors, field effect transistors or other switching devices with the same properties, and the embodiments of the present disclosure will be described by taking the thin film transistors as an example.

In some embodiments, a control electrode of each transistor in a pixel driving circuit is a gate of the transistor, a first electrode of each transistor in the pixel driving circuit is one of a source and a drain of the transistor, and a second electrode of each transistor in the pixel driving circuit is the other one of the source and the drain of the transistor. Since the source and the drain of the transistor may be symmetrical in structure, the source and the drain thereof may be indistinguishable in structure. That is, the first electrode and the second electrode of the transistor in the embodiments of the present disclosure may be indistinguishable in structure. For example, in a case where the transistor is a P-type transistor, the first electrode of the transistor is the source, and the second electrode of the transistor is the drain. As another example, in a case where the transistor is an N-type transistor, the first electrode of the transistor is the drain, and the second electrode of the transistor is the source.

In the circuits provided in the embodiments of the present disclosure, nodes do not represent actual components, but represent junctions of relevant electrical connections in a circuit diagram. That is, these nodes are nodes equivalent to junctions of relevant electrical connections in the circuit diagram.

In an implementation, a relationship between a luminous efficiency of a light-emitting diode (LED) and a current density flowing through the LED is as shown in FIG. 1. It can be seen from FIG. 1 that, at a low current density (e.g., at a current density of J1 to J2), the current density flowing through the LED is small, and thus the luminous efficiency of the LED is low; and at a high current density (e.g., at a current density of J2 to J3), the luminous efficiency of the LED is high.

In the related art, an LED has a large light-emitting area, which is likely to reduce a current density flowing through the LED, and thus reduce a luminous efficiency of the LED. However, in a case where the current density is increased to enhance the luminous efficiency of the LED, power consumption is likely to be increased. In addition, in a case where the LED maintains at a high luminous efficiency for a long time, the LED will work at a high current density for a long time, which will cause a temperature of the LED to rise and a phenomenon of heat accumulation to occur, thereby affecting stability of the LED structure and reducing the luminous efficiency of the LED.

Figure 2:
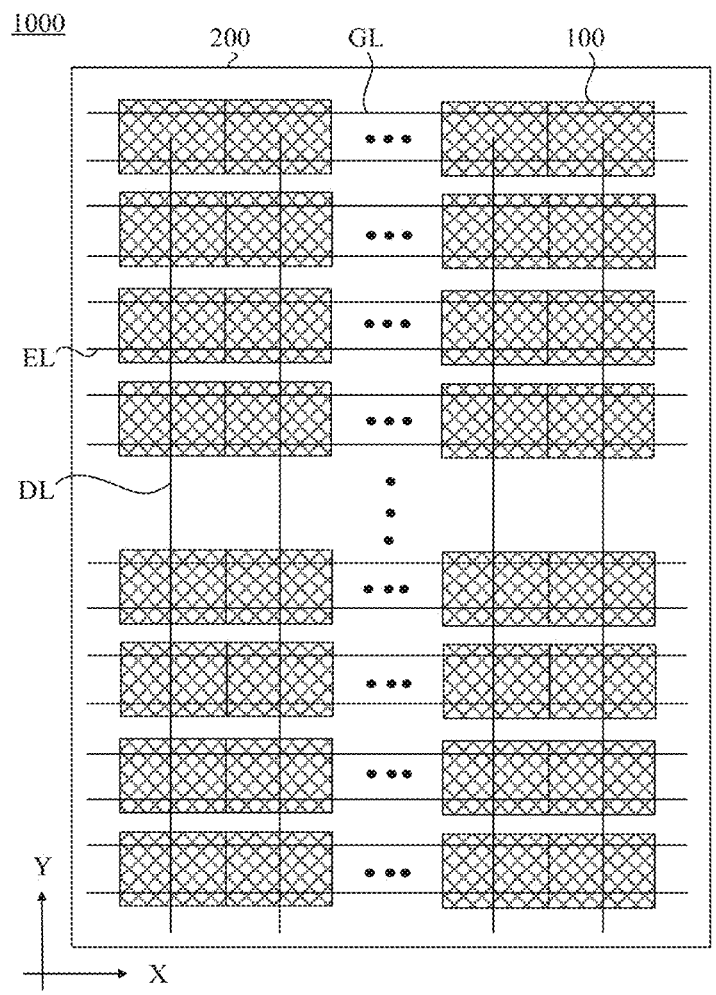
FIG. 2 is a structural diagram of a display substrate, in accordance with some embodiments of the present disclosure.
Figure 3:
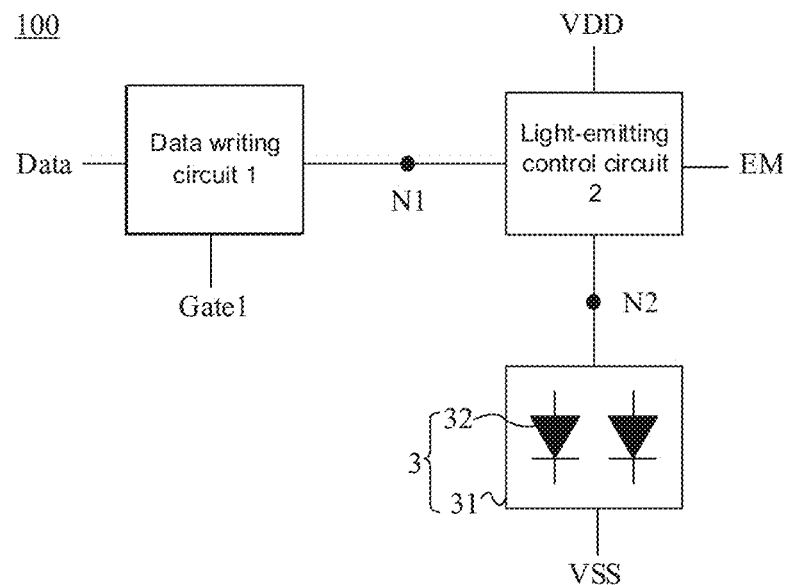
FIG. 3 is a structural diagram of a pixel driving circuit, in accordance with some embodiments of the present disclosure.

In light of this, some embodiments of the present disclosure provide a display substrate 1000. As shown in FIG. 2, the display substrate 1000 includes a substrate 200 and a plurality of pixel driving circuits 100 disposed on a side of the substrate 200. The plurality of pixel driving circuits 100 cooperate with each other to enable the display substrate 1000 to display images.

A type of the substrate 200 varies, which may be set according to actual needs.

For example, the substrate 200 is a rigid substrate. The rigid substrate may be, for example, a glass substrate or a polymethyl methacrylate (PMMA) substrate.

For example, the substrate 200 is a flexible substrate. The flexible substrate may be, for example, a polyethylene terephthalate (PET) substrate, a polyethylene naphthalate two formic acid glycol ester (PEN) substrate or a polyimide (PI) substrate. In this case, the display substrate 1000 may be a flexible display substrate.

In some examples, as shown in FIG. 2, the display substrate 1000 further includes a plurality of gate lines GL, a plurality of data lines DL and a plurality of light-emitting control signal lines EL that are all disposed on the side of the substrate 200. The plurality of gate lines GL may extend in a first direction X, the plurality of data lines DL may extend in a second direction Y, and the plurality of light-emitting control signal lines EL may extend in the first direction X.

Here, the first direction X and the second direction Y intersect each other. An included angle between the first direction X and the second direction Y may be set according to actual needs. For example, the included angle between the first direction X and the second direction Y may be 85°, 89° or 90°.

For example, the plurality of pixel driving circuits 100 may be arranged in a plurality of rows and a plurality of columns; pixel driving circuits 100 in a row are arranged in the first direction X, and pixel driving circuits 100 in a column are arranged in the second direction Y.

For example, pixel driving circuits 100 arranged in a row in the first direction X may be referred to as pixel driving circuits 100 in a same row, and pixel driving circuits 100 arranged in a column in the second direction Y may be referred to as pixel driving circuits 100 in a same column. The pixel driving circuits 100 in the same row may be, for example, electrically connected to at least one gate line GL and at least one light-emitting control signal line EL. The pixel driving circuits 100 in the same column may be, for example, electrically connected to a data line DL. The numbers of the gate lines GL and light-emitting control signal lines EL that are electrically connected to the pixel driving circuits 100 in the same row may be determined according to a structure of the pixel driving circuit 100.

The pixel driving circuit 100 can receive a scanning signal from the gate line GL, a data signal from the data line DL and an enable signal from the light-emitting control signal line EL to emit light.

In some examples, as shown in FIGS. 3 to 5 and 9 to 12, the pixel driving circuit 100 includes a data writing circuit 1, a light-emitting control circuit 2 and a LED chip 3. The data writing circuit 1 is electrically connected to the light-emitting control circuit 2, and the light-emitting control circuit 2 is electrically connected to the LED chip 3.

For example, as shown in FIGS. 5, 14, 15, 17, 19, 21 and 22, the LED chip 3 includes a plurality of light-emitting portions 32.

For example, as shown in FIGS. 5 and 14 to 23, the LED chip 3 may further include a base 31; and the plurality of light-emitting portions 32 included in the LED chip 3 may be located on a same side of the base 31. That is, the plurality of light-emitting portions 32 belong to the same LED chip 3.

It will be noted that the light-emitting control circuit 2 can transmit a first voltage signal to a second node N2. With the cooperation of the first voltage signal from the second node N2 and a second voltage signal received at a second voltage signal terminal VSS, the LED chip 3 can drive the plurality of light-emitting portions 32 to respectively emit light in different periods of time or drive at least two light-emitting portions 32 to emit light in a same period of time.

As for electrical connection relationships between the data writing circuit 1, the light-emitting control circuit 2 and the LED chip 3, and structures of the data writing circuit 1 and the light-emitting control circuit 2, reference may be made to relevant descriptions below, and details will not be described here.

A structure of the LED chip 3 varies. For example, the structure of the LED chip 3 may be a wire-bonding structure, a vertical structure or a flip structure.

The structure of the LED chip 3 will be schematically described below with reference to FIGS. 14 to 23 by taking an example in which the LED chip 3 has the flip structure.

A type of the LED chip 3 varies, which may be set according to actual needs.

For example, the LED chip 3 may be a mini LED chip or a micro LED chip.

A type of the base 31 varies, which may be set according to actual needs.

For example, the base 31 may be a gallium phosphide (GaP) base, a gallium arsenide (GaAs) base, a silicon base, a silicon carbide base or a sapphire base.

Optionally, after the LED chip 3 is bonded to the light-emitting control circuit 2 in the pixel driving circuit 100, the base 31 in the LED chip 3 may be stripped, so that the LED chip 3 in the pixel driving circuit 100 includes only the plurality of light-emitting portions 32. Of course, the base 31 may also be retained after the LED chip 3 is bonded to the light-emitting control circuit 2 in the pixel driving circuit 100. One of the above two situations may be selected according to actual needs.

Figure 14:
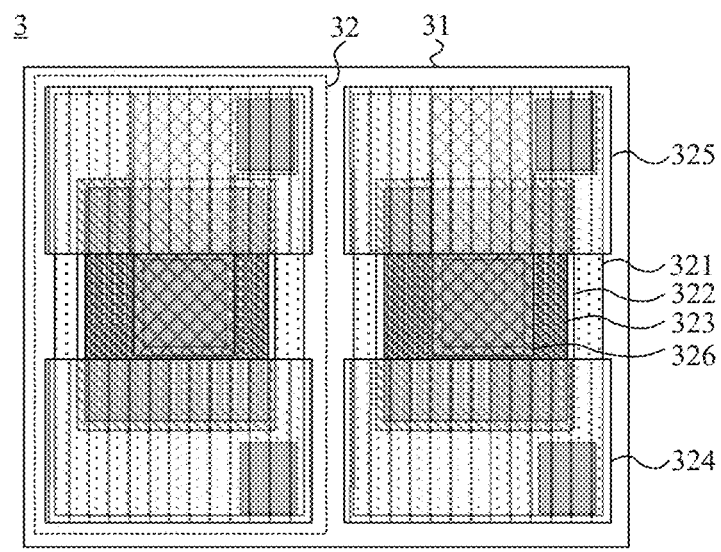
FIG. 14 is a structural diagram of a light-emitting diode chip, in accordance with some embodiments of the present disclosure.
Figure 15:
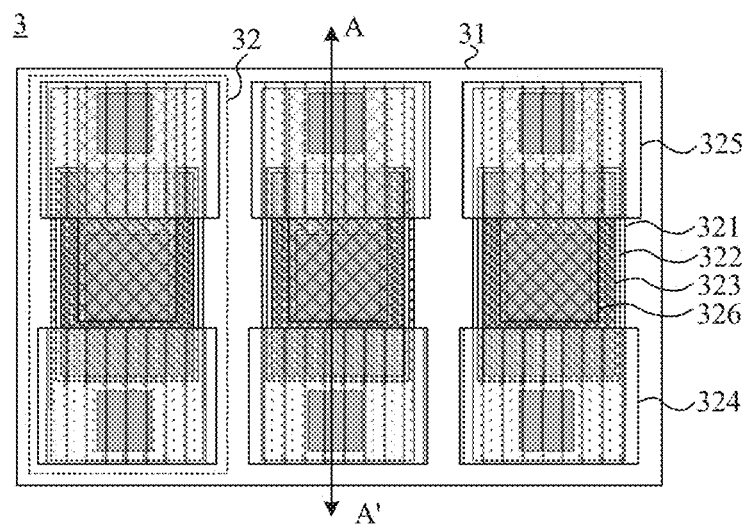
FIG. 15 is a structural diagram of another light-emitting diode chip, in accordance with some embodiments of the present disclosure.
Figure 16:
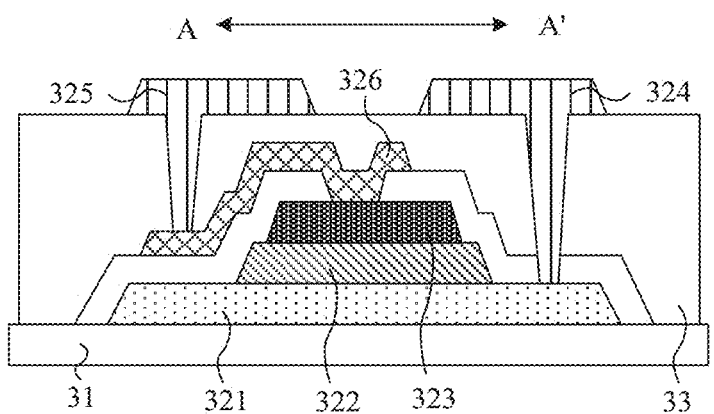
FIG. 16 is a sectional view of the light-emitting diode chip shown in FIG. 15 taken along the line A-A'.

For example, as shown in FIGS. 14 to 16, each light-emitting portion 32 includes a first semiconductor layer 321, a quantum well (OW) layer 322 and a second semiconductor layer 323 that are stacked in sequence. The first semiconductor layer 321 is closer to the base 31 than the quantum well layer 322. The first semiconductor layer 321 and the quantum well layer 322 may be, for example, in direct contact. The quantum well layer 322 and the second semiconductor layer 323 may be, for example, in direct contact.

For example, the quantum well layer 322 may be made of gallium nitride (GaN).

Optionally, the first semiconductor layer 321 and the second semiconductor layer 323 have different doping types.

For example, the first semiconductor layer 321 may be made of a P-type semiconductor material, and correspondingly, the second semiconductor layer 323 may be made of an N-type semiconductor material. Alternatively, the first semiconductor layer 321 may be made of the N-type semiconductor material, and correspondingly, the second semiconductor layer 323 may be made of the P-type semiconductor material.

The first semiconductor layer 321 and the second semiconductor layer 323 include various materials, which may be selected according to actual needs. For example, the first semiconductor layer 321 and the second semiconductor layer 323 have a same intrinsic semiconductor material, and the intrinsic semiconductor material may be any one of GaN, GaP, aluminum gallium arsenide (AlGaAs) and aluminum gallium indium phosphide (AlGaInP).

It will be noted that the type of the base 31 in the LED chip 3 may be determined according to the materials of the first semiconductor layer 321 and the second semiconductor layer 323 in the light-emitting portion 32.

In a case where different voltages are respectively applied to the first semiconductor layer 321 and the second semiconductor layer 323 to form an electric field therebetween, if the intrinsic semiconductor material of the first semiconductor layer 321 and the second semiconductor layer 323 is GaN, the light-emitting portion 32 may emit green light or blue light; and if the intrinsic semiconductor material of the first semiconductor layer 321 and the second semiconductor layer 323 is GaP, AlGaAs or AlGaInP, the light-emitting portion 32 may emit red light.

It will be noted that, in the case where different voltages are respectively applied to the first semiconductor layer 321 and the second semiconductor layer 323 to form the electric field therebetween (that is, in a case where a PN junction with a potential barrier is formed between the first semiconductor layer 321 and the second semiconductor layer 323), when minority carriers and majority carriers recombine in an overlapping region of the first semiconductor layer 321, the quantum well layer 322 and the second semiconductor layer 323 in a direction where they are stacked, excess energy is released in a form of light, and thus electric energy is directly converted into light energy. Therefore, the overlapping region of the first semiconductor layer 321, the quantum well layer 322 and the second semiconductor layer 323 in the direction where they are stacked is substantially a light-emitting region of the light-emitting portion 32, and an area of the overlapping region of the first semiconductor layer 321, the quantum well layer 322 and the second semiconductor layer 323 in the direction where they are stacked is substantially equal to a light-emitting area of the light-emitting portion 32.

For example, as shown in FIGS. 14 to 23, in the plurality of light-emitting portions 32, quantum well layers 322 in any two adjacent light-emitting portions 32 are arranged independently of each other; and second semiconductor layers 323 in any two adjacent light-emitting portions 32 are arranged independently of each other. That is, each light-emitting portion 32 may have a corresponding light-emitting region. The LED chip 3 includes the plurality of light-emitting portions 32, and thus has a plurality of independent light-emitting regions.

For example, as shown in FIGS. 14 to 23, each light-emitting portion 32 further includes at least one of a first bonding electrode 324 and a second bonding electrode 325. That is, only the first bonding electrode 324 may be included in the light-emitting portion 32; or only the second bonding electrode 325 may be included in the light-emitting portion 32; or both the first bonding electrode 324 and the second bonding electrode 325 may be included in the light-emitting portion 32.

For example, an orthographic projection of the first bonding electrode 324 on the base 31 may be in a shape of strip or block, and an area of the orthographic projection of the first bonding electrode 324 on the base 31 is relatively large. An orthographic projection of the second bonding electrode 325 on the base 31 may be in a shape of strip or block, and an area of the orthographic projection of the second bonding electrode 325 on the base 31 is relatively large. Optionally, the area of the orthographic projection of the first bonding electrode 324 on the base 31 and the area of the orthographic projection of the second bonding electrode 325 on the base 31 are both larger than an area of an orthographic projection of the second semiconductor layer 323 on the base 31, which facilitates subsequent bonding and electrical connection between the LED chip 3 and other circuit structures.

Optionally, as shown in FIGS. 14 to 23, the first bonding electrode 324 may be electrically connected to the first semiconductor layer 321 of a corresponding light-emitting portion 32, and the second bonding electrode 325 may be electrically connected to the second semiconductor layer 323 of a corresponding light-emitting portion 32.

For example, in a case where only the first bonding electrode 324 is included in a light-emitting portion 32, the light-emitting portion 32 may share the second bonding electrode 325 of another light-emitting portion 32. In a case where only the second bonding electrode 325 is included in a light-emitting portion 32, the light-emitting portion 32 may share the first bonding electrode 324 of another light-emitting portion 32.

For example, as shown in FIGS. 14 to 23, the orthographic projection of the second semiconductor layer 323 on the base 31 is within an orthographic projection of the first semiconductor layer 321 on the base 31, and an orthographic projection of the quantum well layer 322 on the base 31 is within the orthographic projection of the first semiconductor layer 321 on the base 31. In this way, it facilitates the electrical connection of the first bonding electrode 324 to the first semiconductor layer 321.

In each light-emitting portion 32, one of the first bonding electrode 324 and the second bonding electrode 325 is electrically connected to the second node N2, and the other one of the first bonding electrode 324 and the second bonding electrode 325 is electrically connected to the second voltage signal terminal VSS. In this case, with the cooperation of the first voltage signal and the second voltage signal, at least two light-emitting portion 32 in the plurality of light-emitting portions 32 are driven to emit light simultaneously, or one of the plurality of light-emitting portions 32 is driven to emit light in a certain period of time, and another one of the plurality of light-emitting portions 32 is driven to emit light in a next period of time.

Since the LED chip 3 includes the plurality of light-emitting portions 32, an area of the light-emitting region of each light-emitting portion 32 is smaller than an overall area of the LED chip 3. In this way, in a case where the light-emitting portion 32 is driven to emit light by the same voltage signal as a voltage signal in the related art, a current density flowing through the light-emitting portion 32 may be increased, and luminous efficiencies of the light-emitting portion 32 and the LED chip 3 may be improved.

Based on this, in a case where the LED chip 3 needs to display a low gray scale (e.g., 0 nit to 500 nit), the plurality of light-emitting portions 32 may be driven to emit light in different periods of time. That is, the plurality of light-emitting portions 32 may be driven to emit light alternately. In this way, it may be possible to avoid a situation in which a temperature of the LED chip 3 rises due to a long light-emitting time of a certain light-emitting portion 32, and it is beneficial to ameliorate the heat accumulation, thereby avoiding a low luminous efficiency of the LED chip 3 due to the heat accumulation.

In a case where the LED chip 3 needs to display a high gray scale (e.g., 500 nit or more), at least two light-emitting portions 32 in the plurality of light-emitting portions 32 may be driven to emit light simultaneously. In this case, current densities flowing through the at least two light-emitting portions 32 may be low current densities, e.g., current densities of J1 to J2 shown in FIG. 1. The at least two light-emitting portions 32 as a whole may realize display of the high gray scale. In this way, it may be possible to reduce a current density flowing through each light-emitting portion 32. Even if the at least two light-emitting portions 32 need to keep emitting light for a long time, it may also be possible to avoid generating excess heat and avoid a situation in which the temperature of the LED chip 3 rises, and it is beneficial to ameliorate the heat accumulation, thereby avoiding the low luminous efficiency of the LED chip 3 due to the heat accumulation.

Therefore, in the display substrate 1000 provided in the embodiments of the present disclosure, by designing the LED chip 3 in the pixel driving circuit 100 in such a structure that the LED chip 3 includes the plurality of light-emitting portions 32 that may emit light independently, it may be possible to enable each light-emitting portion 32 to have a small light-emitting area, which is beneficial to increasing the current density flowing through the light-emitting portion 32 and improving the luminous efficiency of the LED chip 3.

In addition, during display of the display substrate 100, according to a desired display image, the plurality of light-emitting portions 32 in the LED chip 3 may be driven to emit light alternately, or at least two light-emitting portions 32 in the LED chip 3 may be driven to emit light simultaneously. In this way, in a case where the current density flowing through the light-emitting portion 32 is large, a situation in which the light-emitting portion 32 emits light for a long time may be avoided; and in a case where the light-emitting portion 32 emits light for a long time, a situation in which the current density flowing through the light-emitting portion 32 is large may be avoided. As a result, it may be possible to avoid the situation in which the temperature of the LED chip 3 rises, and it is beneficial to ameliorate the heat accumulation, thereby avoiding the low luminous efficiency of the LED chip 3 due to the heat accumulation.

Here, an arrangement of the plurality of light-emitting portions 32 included in the LED chip 3 varies, which may be set according to actual needs.

In some embodiments, as shown in FIGS. 14 to 21, a gap exists between first semiconductor layers 321 in any two adjacent light-emitting portions 32; a gap exists between quantum well layers 322 in any two adjacent light-emitting portions 32, and a gap exists between second semiconductor layers 323 in any two adjacent light-emitting portions 32. That is, the plurality of light-emitting portions 32 are arranged independently of each other, which facilitates flexible control of light-emitting states of different light-emitting portions 32.

Based on this, connection relationships between the first semiconductor layer 321 and the first bonding electrode 324 of each light-emitting portion 32 and between the second semiconductor layer 323 and the second bonding electrode 325 of each light-emitting portion 32 vary, which may be set according to actual needs.

In some examples, as shown in FIGS. 14 to 16, each light-emitting portion 32 includes the first bonding electrode 324 and the second bonding electrode 325. In addition, first bonding electrodes 324 included in different light-emitting portions 32 are different, and second bonding electrodes 325 included in different light-emitting portions 32 are different.

That is, in the plurality of light-emitting portions 32 included in the LED chip 3, different light-emitting portions 32 do not share the first bonding electrode 324 and the second bonding electrode 325. The first bonding electrodes 324 included in different light-emitting portions 32 are arranged independently of each other, and the second bonding electrodes 325 included in different light-emitting portions 32 are arranged independently of each other.

For example, as shown in FIGS. 14 to 16, each light-emitting portion 32 further includes a layer-changed electrode 326. The LED chip 3 further includes an encapsulation layer 33 disposed on a side of the layer-changed electrode 326 away from the base 31. A passivation layer is provided between the layer-changed electrode 326 and the second semiconductor layer 323; the orthographic projection of the first semiconductor layer 321 of each light-emitting portion 32 on the base 31 is, for example, within an orthographic projection of the passivation layer on the base 31. The first bonding electrode 324 and the second bonding electrode 325 are disposed on a side of the encapsulation layer 33 away from the base 31. The orthographic projection of the first semiconductor layer 321 of each light-emitting portion 32 on the base 31 is, for example, within an orthographic projection of the encapsulation layer 33 on the base 31.

For example, as shown in FIG. 16, the layer-changed electrode 326 penetrates the passivation layer to be in direct contact with the second semiconductor layer 323, so as to achieve electrical connection. Since a portion of an orthographic projection of the layer-changed electrode 326 on the base 31 does not overlap with the orthographic projection of the second semiconductor layer 323 on the base 31, the layer-changed electrode 326 may be used for connecting the second semiconductor layer 323 to an electrode that is in a layer in other region different from the second semiconductor layer 323, which facilitates the electrical connection of the second semiconductor layer 323 to the second bonding electrode 325 subsequently.

For example, as shown in FIG. 16, the first bonding electrode 324 penetrates the encapsulation layer 33 and the passivation layer to be in direct contact with the first semiconductor layer 321, so as to achieve electrical connection. The second bonding electrode 325 penetrates the encapsulation layer 33 to be in direct contact with the layer-changed electrode 326. Therefore, the second bonding electrode 325 is electrically connected to the second semiconductor layer 323 through the layer-changed electrode 326.

Optionally, the layer-changed electrode 326 is made of a material with a high light transmittance. For example, the layer-changed electrode 326 is made of indium tin oxide (ITO).

By arranging the plurality of light-emitting portions 32 independently of each other, and arranging the first bonding electrodes 324 and the second bonding electrodes 325 included in different light-emitting portions 32 independently of each other, it helps realize independent control of the light-emitting state of each light-emitting portion 32.

Figure 17:
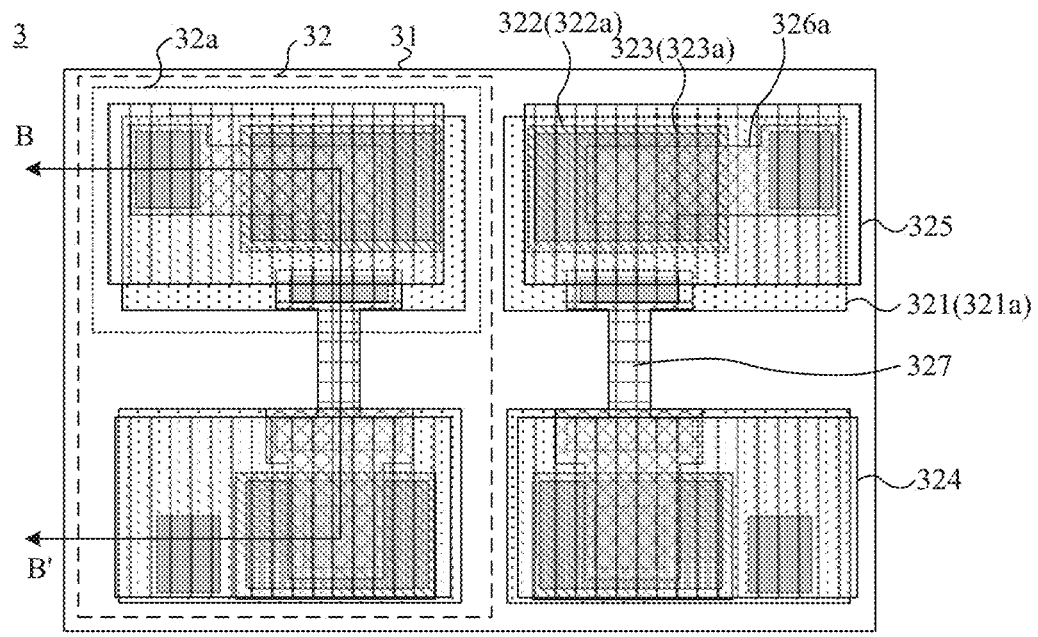
FIG. 17 is a structural diagram of yet another light-emitting diode chip, in accordance with some embodiments of the present disclosure.
Figure 18:
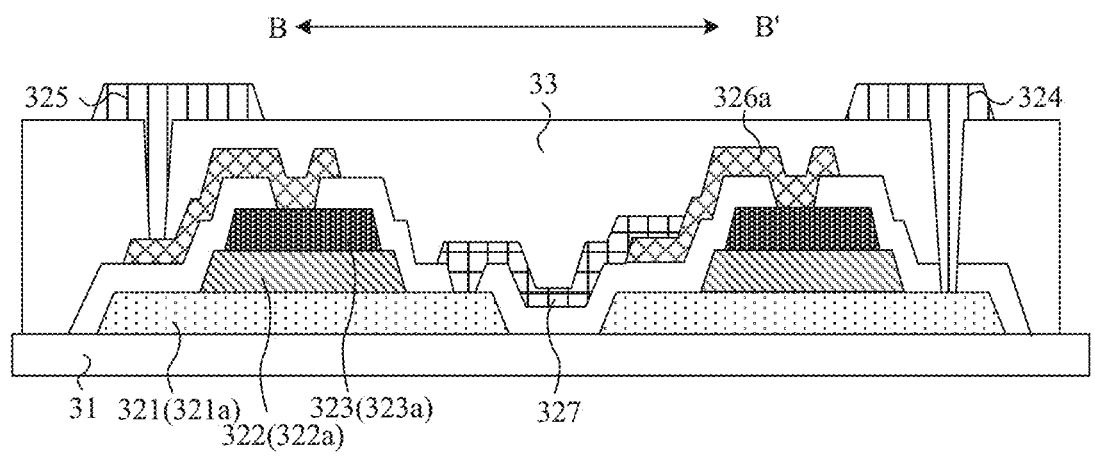
FIG. 18 is a sectional view of the light-emitting diode chip shown in FIG. 17 taken along the line B-B'.

In an example, as shown in FIGS. 17 and 18, at least one light-emitting portion 32 in the light-emitting portions 32 may include a plurality of light-emitting sub-portions 32a arranged in series. In this case, the light-emitting portion 32 may be referred to as a high-voltage light-emitting portion, and a voltage difference between the first bonding electrode 324 and the second bonding electrode 325 of the light-emitting portion 32 may be multiple times a voltage difference between the first bonding electrode 324 and the second bonding electrode 325 of remaining light-emitting portions 32. The remaining light-emitting portions 32 do not include the plurality of light-emitting sub-portions 32a. In a case where each of the plurality of light-emitting portions 32 included in the LED chip 3 includes the plurality of light-emitting sub-portions 32a arranged in series, the LED chip 3 may be referred to a high voltage chip.

For example, as shown in FIGS. 17 and 18, each light-emitting sub-portion 32a includes a first semiconductor sub-layer 321a, a first quantum well sub-layer 322a and a second semiconductor sub-layer 323a that are stacked in sequence. A gap exists between first semiconductor sub-layers 321a in any two adjacent light-emitting sub-portions 32a; a gap exists between first quantum well sub-layers 322a in any two adjacent light-emitting sub-portions 32a; and a gap exists between second semiconductor sub-layers 323a in any two adjacent light-emitting sub-portions 32a. That is, the plurality of light-emitting sub-portions 32a are arranged independently of each other.

Optionally, as shown in FIGS. 17 and 18, the first semiconductor sub-layer 321a of one light-emitting sub-portion 32a is electrically connected to the first bonding electrode 324 of a light-emitting portion 32 to which the one light-emitting sub-portion 32a belongs. The second semiconductor sub-layer 323a of another light-emitting sub-portion 32a is electrically connected to the second bonding electrode 325 of the light-emitting portion 32 to which the one light-emitting sub-portion 32a and the another light-emitting sub-portion 32a belong.

A relationship between the one light-emitting sub-portion 32a and the another light-emitting sub-portion 32a is related to the number of light-emitting sub-portions 32a included in the light-emitting portion 32.

It will be noted that, as shown in FIGS. 17 and 18, each light-emitting sub-portion 32a may further include, for example, a layer-changed sub-electrode 326a electrically connected to the second semiconductor sub-layer 323a.

For example, as shown in FIGS. 17 and 18, the light-emitting portion 32 includes two light-emitting sub-portions 32a. In this case, the light-emitting portion 32 may further include a bridge electrode 327.

An end of the bridge electrode 327 may be electrically connected to the layer-changed sub-electrode 326a of the one light-emitting sub-portion 32a, so that the bridge electrode 327 may be electrically connected to the second semiconductor sub-layer 323a of the one light-emitting sub-portion 32a through the layer-changed sub-electrode 326a. Another end of the bridge electrode 327 may penetrate the passivation layer to be electrically connected to the first semiconductor sub-layer 321a of the another light-emitting sub-portion 32a.

In this way, the one light-emitting sub-portion 32a and the another light-emitting sub-portion 32a may be connected through the bridge electrode 327 that is in a layer different from layers where the one light-emitting sub-portion 32a and the another light-emitting sub-portion 32a are located, thereby achieving arrangement in series. In a process of driving the light-emitting portion 32 to emit light, an electrical signal may sequentially pass through the first bonding electrode 324 of the light-emitting portion 32, the first semiconductor sub-layer 321a and the layer-changed sub-electrode 326a of the one light-emitting sub-portion 32a, the bridge electrode 327, the first semiconductor sub-layer 321a and the layer-changed sub-electrode 326a of the another light-emitting sub-portion 32a, and the second bonding electrode 325 of the light-emitting portion 32, so as to drive the two light-emitting sub-portions 32a to emit light simultaneously.

As another example, the light-emitting portion 32 includes three light-emitting sub-portions 32a. In this case, the light-emitting portion 32 may include two bridge electrodes 327. The one light-emitting sub-portion 32a may be arranged in series with a third light-emitting sub-portion 32a through one bridge electrode 327, and the third light-emitting sub-portion 32a may be arranged in series with the another light-emitting sub-portion 32a through the other bridge electrode 327. As for electrical connection between two adjacent light-emitting sub-portions 32a, reference may be made to the description in the above examples, and details will not be repeated here.

A shape of an orthographic projection of the bridge electrode 327 on the base 31 varies, which may be determined according to an arrangement position of the light-emitting sub-portions 32a.

For example, the shape of the orthographic projection of the bridge electrode 327 on the base 31 includes a bar shape, a U shape or an H shape.

Figure 19:
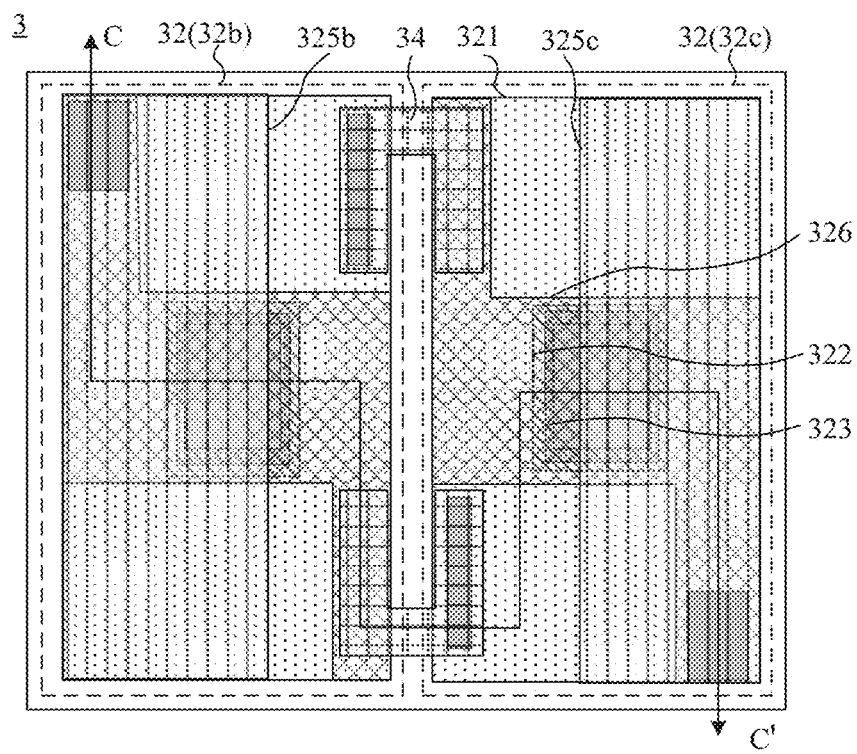
FIG. 19 is a structural diagram of yet another light-emitting diode chip, in accordance with some embodiments of the present disclosure.
Figure 20:
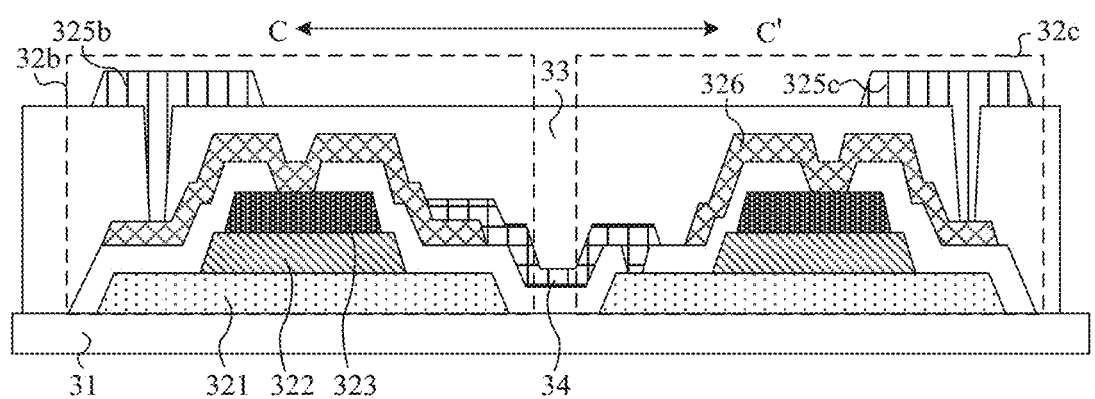
FIG. 20 is a sectional view of the light-emitting diode chip shown in FIG. 19 taken along the line C-C'.
Figure 21:
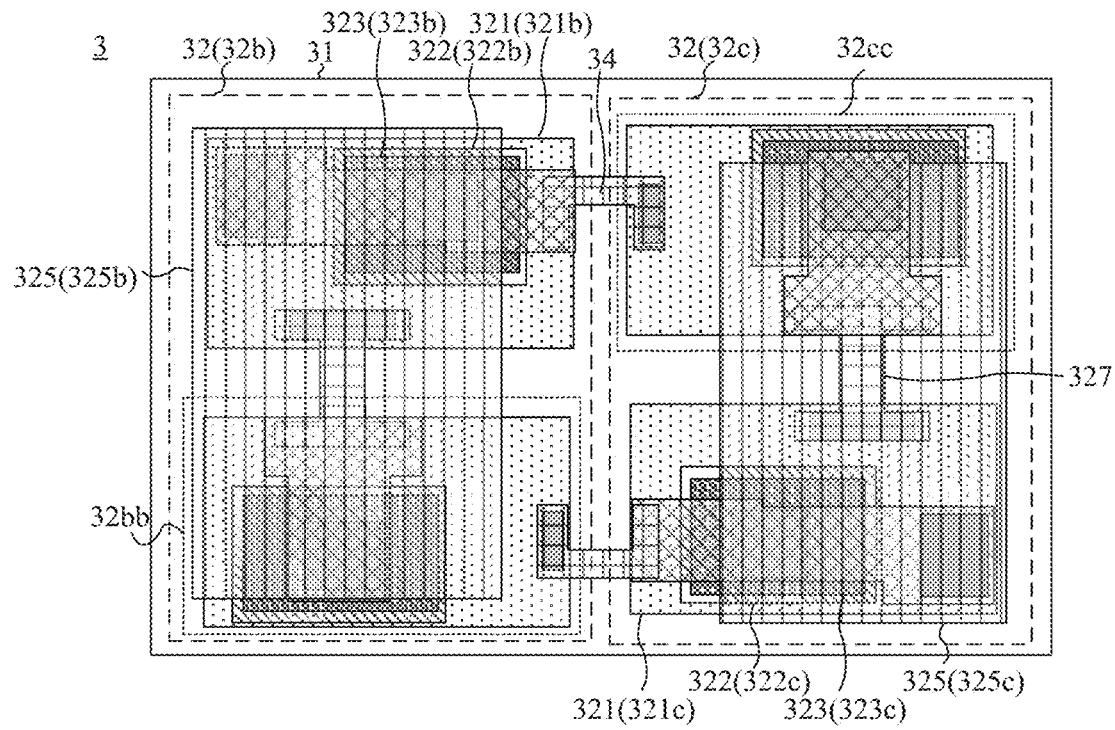
FIG. 21 is a structural diagram of yet another light-emitting diode chip, in accordance with some embodiments of the present disclosure.

In some other examples, as shown in FIGS. 19 to 21, the plurality of light-emitting portions 32 included in the LED chip 3 include at least one first light-emitting portion 32b and at least one second light-emitting portion 32c. That is, there may be one or more first light-emitting portions 32b, and there may be one or more second light-emitting portions 32c.

For example, as shown in FIG. 19, the first semiconductor layer 321 of the first light-emitting portion 32b and the second semiconductor layer 323 of the second light-emitting portion 32c are electrically connected to a second bonding electrode 325c. That is, the first semiconductor layer 321 of the first light-emitting portion 32b and the second semiconductor layer 323 of the second light-emitting portion 32c share the second bonding electrode 325c.

As shown in FIGS. 19 and 20, the second bonding electrode 325c in this example is, for example, the second bonding electrode 325 of the second light-emitting portion 32c. Of course, since the second bonding electrode 325c is further electrically connected to the first semiconductor layer 321 of the first light-emitting portion 32b, the second bonding electrode 325c may also be regarded as the first bonding electrode 324 of the first light-emitting portion 32b. In the embodiments of the present disclosure, in order to clearly describe the structure of the LED chip 3, the second bonding electrode 325c is allocated to the second light-emitting portion 32c.

For example, as shown in FIGS. 19 and 20, the second semiconductor layer 323 of the first light-emitting portion 32b and the first semiconductor layer 321 of the second light-emitting portion 32c are electrically connected to another second bonding electrode 325b. That is, the second semiconductor layer 323 of the first light-emitting portion 32b and the first semiconductor layer 321 of the second light-emitting portion 32c share the another second bonding electrode 325b.

As shown in FIGS. 19 and 20, the second bonding electrode 325b in this example is, for example, the second bonding electrode 325 of the first light-emitting portion 32b. Of course, since the second bonding electrode 325b is further electrically connected to the first semiconductor layer 321 of the second light-emitting portion 32c, the second bonding electrode 325b may also be regarded as the first bonding electrode 324 of the second light-emitting portion 32c. In the embodiments of the present disclosure, in order to clearly describe the structure of the LED chip 3, the second bonding electrode 325b is allocated to the first light-emitting portion 32b.

In a process of an electrical signal being transmitted, the electrical signal may be transmitted from the second bonding electrode 325c of the second light-emitting portion 32c to the second bonding electrode 325b of the first light-emitting portion 32b through the first semiconductor layer 321 of the first light-emitting portion 32b and the second semiconductor layer 323 of the first light-emitting portion 32b in sequence, so that the first light-emitting portion 32b may be driven to emit light; or the electrical signal may be transmitted from the second bonding electrode 325b of the first light-emitting portion 32b to the second bonding electrode 325c of the second light-emitting portion 32c through the first semiconductor layer 321 of the second light-emitting portion 32c and the second semiconductor layer 323 of the second light-emitting portion 32c in sequence, so that the second light-emitting portion 32c may be driven to emit light.

An arrangement between the first light-emitting portion 32b and the second light-emitting portion 32c may be referred to as a reverse bias arrangement. By adjusting a transmission direction of the electrical signal, it may be possible to enable the first light-emitting portion 32b and the second light-emitting portion 32c to emit light alternately.

In a case where the plurality of light-emitting portions 32 include first light-emitting portions 32b and second light-emitting portions 32c, the first light-emitting portions 32b and the second light-emitting portions 32c may be divided into a plurality of groups. Each group includes a first light-emitting portion 32b and a second light-emitting portion 32c, and the first light-emitting portion 32b and the second light-emitting portion 32c are reversely biased.

Of course, the first light-emitting portion 32b and the second light-emitting portion 32c may be arranged in other manners, as long as the first light-emitting portion 32b and the second light-emitting portion 32c can be arranged in reverse bias.

In an example, as shown in FIGS. 19 and 20, the LED chip 3 further includes a plurality of connection portions 34.

For example, as shown in FIG. 19, in the first light-emitting portion 32b and the second light-emitting portion 32c that are reversely biased, the first semiconductor layer 321 of the first light-emitting portion 32b is electrically connected to the second semiconductor layer 323 of the second light-emitting portion 32c through a connection portion 34.

Optionally, as shown in FIG. 20, an end of the connection portion 34 penetrates the passivation layer to be in direct contact with the first semiconductor layer 321 of the first light-emitting portion 32b, so that electrical connection is achieved; and another end of the connection portion 34 is electrically connected to the layer-changed electrode 326 of the second light-emitting portion 32c, so as to be electrically connected to the second semiconductor layer 323 of the second light-emitting portion 32c through the layer-changed electrode 326.

In this way, electrical connections between the first semiconductor layer 321 of the first light-emitting portion 32b and the second semiconductor layer 323 of the second light-emitting portion 32c and between the first semiconductor layer 321 of the first light-emitting portion 32b and a corresponding second bonding electrode 325c are achieved.

For example, as shown in FIGS. 19 and 20, in the first light-emitting portion 32b and the second light-emitting portion 32c that are reversely biased, the first semiconductor layer 321 of the second light-emitting portion 32c is electrically connected to the second semiconductor layer 323 of the first light-emitting portion 32b through a connection portion 34.

Optionally, as shown in FIGS. 19 and 20, an end of the connection portion 34 penetrates the passivation layer to be in direct contact with the first semiconductor layer 321 of the second light-emitting portion 32c, so that electrical connection is achieved; and another end of the connection portion 34 is electrically connected to the layer-changed electrode 326 of the first light-emitting portion 32b, so as to be electrically connected to the second semiconductor layer 323 of the first light-emitting portion 32b through the layer-changed electrode 326.

In this way, electrical connections between the first semiconductor layer 321 of the second light-emitting portion 32c and the second semiconductor layer 323 of the first light-emitting portion 32b and between the first semiconductor layer 321 of the second light-emitting portion 32c and a corresponding second bonding electrode 325b are achieved.

A material of the connection portion 34 varies, which may be set according to actual needs. For example, the material of the connection portion 34 may be chromium (Cr), titanium (Ti), or the like. For example, the material of the connection portion 34 is the same as a material of the bridge electrode 327 in some of the above examples.

A shape of an orthographic projection of the connection portion 34 on the base 31 varies, which may be set according to a relative positional relationship between the first light-emitting portion 32b and the second light-emitting portion 32c.

For example, the shape of the orthographic projection of the connection portion 34 on the base 31 includes a bar shape, a U shape or an H shape.

In an example, as shown in FIG. 21, the first light-emitting portion 32b includes a plurality of first light-emitting sub-portions 32bb that are arranged in series. Each first light-emitting sub-portion 32bb includes a third semiconductor sub-layer 321b, a second quantum well sub-layer 322b and a fourth semiconductor sub-layer 323b that are stacked in sequence. The plurality of first light-emitting sub-portions 32bb are, for example, arranged independently of each other.

As shown in FIG. 21, the second light-emitting portion 32c includes, for example, a plurality of second light-emitting sub-portions 32cc that are arranged in series. Each second light-emitting sub-portion 32cc includes a fifth semiconductor sub-layer 321c, a third quantum well sub-layer 322c and a sixth semiconductor sub-layer 323c that are stacked in sequence. The plurality of second light-emitting portions 32c are, for example, arranged independently of each other.

For example, as shown in FIG. 21, the third semiconductor sub-layer 321b of a first light-emitting sub-portion 32bb in the plurality of first light-emitting sub-portions 32bb is electrically connected to a corresponding second bonding electrode 325c, and is electrically connected to the sixth semiconductor sub-layer 323c of a second light-emitting sub-portion 32cc in the plurality of second light-emitting sub-portions 32cc.

Here, the first light-emitting sub-portion 32bb is a first light-emitting sub-portion 32bb in the plurality of first light-emitting sub-portions 32bb that firstly receives an electrical signal. That is, in a process of the electrical signal being transmitted, after passing through the corresponding second bonding electrode 325c, the electrical signal is transmitted to the first light-emitting sub-portion 32*bb*, and is then transmitted to other first light-emitting sub-portion(s) 32*bb*. The second light-emitting sub-portion 32*cc* is a second light-emitting sub-portion 32*cc* in the plurality of second light-emitting sub-portions 32*cc* that finally receives an electrical signal. That is, in a process of the electrical signal being transmitted, the electrical signal passes through the second light-emitting sub-portion 32*cc* to be transmitted to the corresponding second bonding electrode 325*c* after passing through other second light-emitting sub-portion(s) 32*cc*.

It will be noted that, the second bonding electrode 325*c* in this example is, for example, the second bonding electrode 325 of the second light-emitting sub-portion 32*cc*. Of course, since the second bonding electrode 325*c* is further electrically connected to the third semiconductor sub-layer 321*b* of the first light-emitting sub-portion 32*bb*, the second bonding electrode 325*c* may also be regarded as the first bonding electrode 324 of the first light-emitting sub-portion 32*bb*. In the embodiments of the present disclosure, in order to clearly describe the structure of the LED chip 3, the second bonding electrode 325*c* is allocated to the second light-emitting sub-portion 32*cc*.

For example, as shown in FIG. 21, the fifth semiconductor sub-layer 321*c* of a second light-emitting sub-portion 32*cc* in the plurality of second light-emitting sub-portions 32*cc* is electrically connected to another corresponding second bonding electrode 325*b*, and is electrically connected to the fourth semiconductor sub-layer 323*b* of a first light-emitting sub-portion 32*bb* in the plurality of first light-emitting sub-portions 32*bb*.

Here, the second light-emitting sub-portion 32*cc* is a second light-emitting sub-portion 32*cc* in the plurality of second light-emitting sub-portions 32*cc* that firstly receives an electrical signal. That is, in a process of the electrical signal being transmitted, after passing through the another corresponding second bonding electrode 325*b*, the electrical signal is transmitted to the second light-emitting sub-portion 32*cc*, and is then transmitted to other second light-emitting sub-portion(s) 32*cc*. The first light-emitting sub-portion 32*bb* is a first light-emitting sub-portion 32*bb* in the plurality of first light-emitting sub-portions 32*bb* that finally receives an electrical signal. That is, in a process of the electrical signal being transmitted, the electrical signal passes through the first light-emitting sub-portion 32*bb* to be transmitted to the another corresponding second bonding electrode 325*b* after passing through other first light-emitting sub-portion(s) 32*bb*.

It will be noted that, the second bonding electrode 325*b* in this example is, for example, the second bonding electrode 325 of the first light-emitting sub-portion 32*bb*. Of course, since the second bonding electrode 325*b* is further electrically connected to the fifth semiconductor sub-layer 321*c* of the second light-emitting sub-portion 32*cc*, the second bonding electrode 325*b* may also be regarded as the first bonding electrode 324 of the second light-emitting sub-portion 32*cc*. In the embodiments of the present disclosure, in order to clearly describe the structure of the LED chip 3, the second bonding electrode 325*b* is allocated to the first light-emitting sub-portion 32*bb*.

Optionally, for a connection manner between any two adjacent first light-emitting sub-portions 32*bb* in the plurality of first light-emitting sub-portions 32*bb*, reference may be made to the connection manner between any two adjacent light-emitting sub-portions 32*a* in some of the above embodiments; and for a connection manner between any two adjacent second light-emitting sub-portions 32*cc* in the plurality of second light-emitting sub-portions 32*cc*, reference may be made to the connection manner between any two adjacent light-emitting sub-portions 32*a* in some of the above embodiments. Details will not be repeated here.

Figure 22:
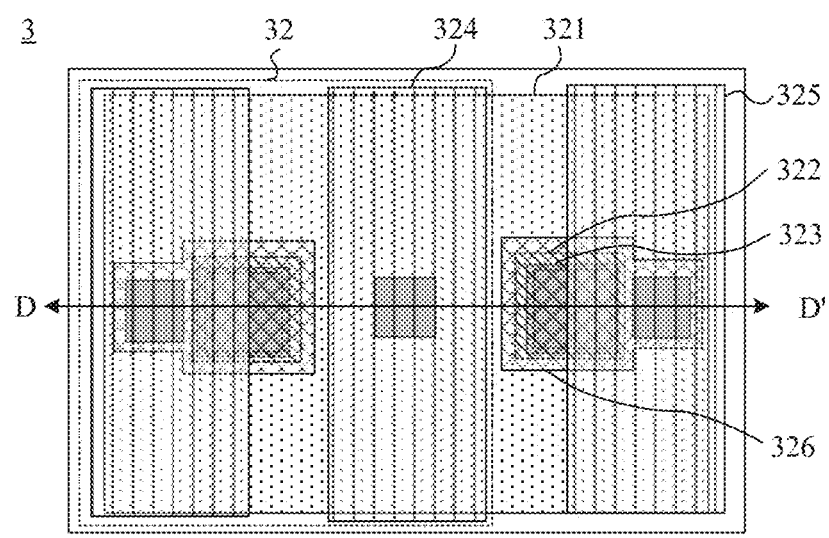
FIG. 22 is a structural diagram of yet another light-emitting diode chip, in accordance with some embodiments of the present disclosure.
Figure 23:
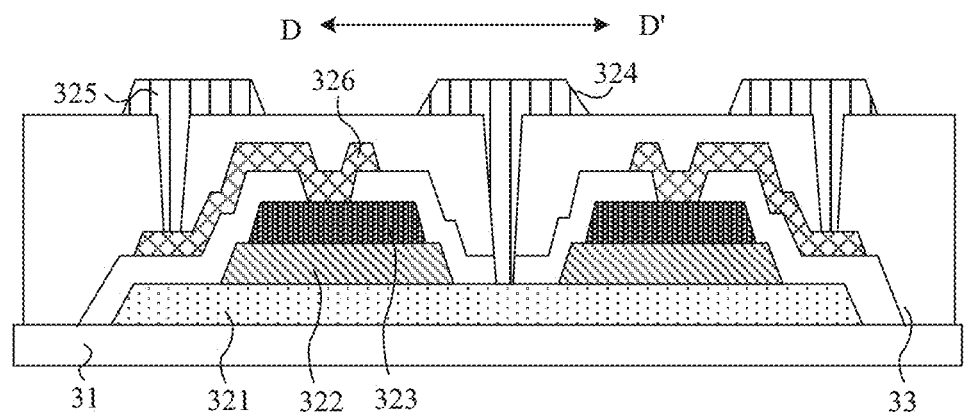
FIG. 23 is a sectional view of the light-emitting diode chip shown in FIG. 22 taken along the line D-D'.

In some other embodiments, as shown in FIGS. 22 and 23, the quantum well layer 322 of each light-emitting portion 32 is independently arranged, and the second semiconductor layer 323 of the light-emitting portion 32 is independently arranged. First semiconductor layers 321 in at least two light-emitting portions 32 are of a one-piece structure.

Based on this, as shown in FIGS. 22 and 23, the first semiconductor layers 321 in the at least two light-emitting portions 32 may be electrically connected to a same first bonding electrode 324. That is, the at least two light-emitting portions 32 share the same first bonding electrode 324.

In a process of an electrical signal being transmitted, the electrical signal may be simultaneously transmitted to the first semiconductor layers 321 in the at least two light-emitting portions 32 through the first bonding electrode 324. By controlling a connection relationship between each of the second bonding electrodes 325 in the at least two light-emitting portions 32 and the second node N2 or the second voltage signal terminal VSS, the at least two light-emitting portions 32 may be driven to emit light simultaneously, or the at least two light-emitting portions 32 may be driven to emit light in different periods of time respectively.

By arranging the first semiconductor layers 321 in the at least two light-emitting portions 32 to be of the one-piece structure, it may be possible to not only avoid a patterning process for forming the first semiconductor layers 321, so as to simplify a manufacturing process of the LED chip 3, but also reduce the number of first bonding electrodes 324, so as to simplify the structure of the LED chip 3.

For example, as shown in FIGS. 22 and 23, first semiconductor layers 321 in the plurality of light-emitting portions 32 included in the LED chip 3 are of a one-piece structure. In this way, after the material of the first semiconductor layers 321 is formed on the side of the base 31, the first semiconductor layers 321 in the plurality of light-emitting portions 32 may be formed, which further reduces the patterning process, and helps further simplify the manufacturing process of the LED chip 3.

A structure of the pixel driving circuit 100 will be schematically described below with reference to FIGS. 3 to 5 and 9 to 12.

In some examples, as shown in FIGS. 3 to 5 and 9 to 12, the data writing circuit 1 included in the pixel driving circuit 100 is electrically connected to a first scanning signal terminal Gate1, a data signal terminal Data and a first node N1. The data writing circuit 1 is configured to transmit a data signal received at the data signal terminal Data to the first node N1 in response to a first scanning signal received at the first scanning signal terminal Gate1.

For example, in a case where a level of the first scanning signal is a level required for turning on the data writing circuit 1, the data writing circuit 1 may be turned on under control of the first scanning signal to receive and then transmit the data signal to the first node N1, so as to charge the first node N1.

In some examples, as shown in FIGS. 3 to 5 and 9 to 12, the light-emitting control circuit 2 included in the pixel driving circuit 100 is electrically connected to the first node N1, an enable signal terminal EM, a first voltage signal terminal VDD and the second node N2. The light-emitting control circuit 2 is configured to transmit a first voltage signal received at the first voltage signal terminal VDD to the second node N2 under control of a voltage of the first node N1 and an enable signal transmitted by the enable signal terminal EM.

For example, in a case where the voltage of the first node N1 and a level of the enable signal are a voltage and a level that are required for turning on the light-emitting control circuit 2 respectively, the light-emitting control circuit 2 may be turned on under the control of the voltage of the first node N1 and the enable signal to receive and then transmit the first voltage signal to the second node N2.

In some examples, as shown in FIGS. 3 to 5 and 9 to 12, the LED chip 3 included in the pixel driving circuit 100 is electrically connected to the second node N2 and the second voltage signal terminal VSS. The LED chip 3 includes the plurality of light-emitting portions 32. The LED chip 3 is configured to, with the cooperation of the first voltage signal from the second node N2 and the second voltage signal received at the second voltage signal terminal VSS, drive the plurality of light-emitting portions 32 included in the LED chip 3 to emit light in different periods of time respectively, or drive at least two light-emitting portions 32 to emit light in the same period of time.

For example, in the same period of time, the first voltage signal is at a high level and the second voltage signal is at a low level; or the first voltage signal is at a low level and the second voltage signal is at a high level. That is, in the same period of time, there is a voltage difference between the first voltage signal and the second voltage signal. With the cooperation of the first voltage signal and the second voltage signal, an electrical signal for driving the light-emitting portion 32 to emit light is generated between the second node N2 and the second voltage signal terminal VSS. The electrical signal may drive different light-emitting portions 32 to emit light in different periods of time respectively or drive the at least two light-emitting portions 32 to emit light simultaneously in the same period of time.

Beneficial effects that can be achieved by the pixel driving circuit 100 provided in some embodiments of the present disclosure are the same as the beneficial effects that can be achieved by the display substrate 1000 provided in some of the above embodiments, and details will not be repeated here.

It will be noted that the term "electrically connected" mentioned herein may be "directly electrically connected" or "indirectly electrically connected", which may be set according to actual needs.

Figure 5:
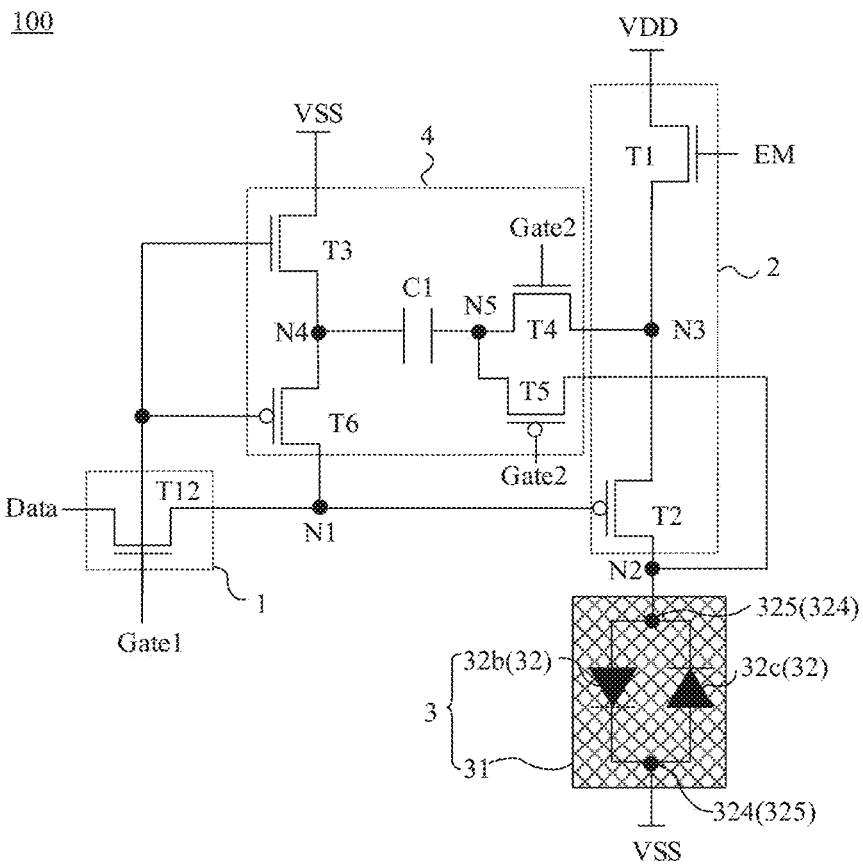
FIG. 5 is a circuit diagram of a pixel driving circuit, in accordance with some embodiments of the present disclosure.

In some embodiments, as shown in FIG. 5, the plurality of light-emitting portions 32 include at least one first light-emitting portion 32b and at least one second light-emitting portion 32c.

In some examples, as shown in FIG. 5, the first bonding electrode 324 of the first light-emitting portion 32b is electrically connected to the second node N2, and the second bonding electrode 325 of the first light-emitting portion 32b is electrically connected to the second voltage signal terminal VSS; the first bonding electrode 324 of the second light-emitting portion 32c is electrically connected to the second voltage signal terminal VSS, and the second bonding electrode 325 of the second light-emitting portion 32c is electrically connected to the second node N2.

Here, in terms of structure, the first bonding electrode 324 of the first light-emitting portion 32b and the second bonding electrode 325 of the second light-emitting portion 32c may be a same bonding electrode, and the second bonding electrode 325 of the first light-emitting portion 32b and the first bonding electrode 324 of the second light-emitting portion 32c may be a same bonding electrode. As for details, reference may be made to the description in some of the above embodiments, which will not be repeated here.

As can be seen from the above, the first light-emitting portion 32b and the second light-emitting portion 32c are reversely biased. In this way, in the case where the first voltage signal is at the high level and the second voltage signal is at the low level, the first light-emitting portion 32b may emit light due to the action of the first voltage signal and the second voltage signal; and in the case where the first voltage signal is at the low level and the second voltage signal is at the high level, the second light-emitting portion 32c may emit light due to the action of the first voltage signal and the second voltage signal. That is, during display of the LED chip 3, the first light-emitting portion 32b and the second light-emitting portion 32c may emit light alternately.

In this way, in the case where the LED chip 3 needs to display a low gray scale, the first light-emitting portion 32b and the second light-emitting portion 32c may be driven to emit light in different periods of time respectively. In this way, it may be possible to avoid the situation in which the temperature of the LED chip 3 rises due to a long light-emitting time of the first light-emitting portion 32b or the second light-emitting portion 32c. It is beneficial to ameliorate the heat accumulation, thereby avoiding the low luminous efficiency of the LED chip 3 due to the heat accumulation.

In addition, by arranging the first light-emitting portion 32b and the second light-emitting portion 32c in reverse bias, it is beneficial to prolong a service life of the LED chip 3 for performing display.

For example, as shown in FIG. 5, the first bonding electrode 324 of the first light-emitting portion 32b is directly electrically connected to the second node N2; the second bonding electrode 325 of the first light-emitting portion 32b is directly electrically connected to the second voltage signal terminal VSS; the first bonding electrode 324 of the second light-emitting portion 32c is directly electrically connected to the second voltage signal terminal VSS; and the second bonding electrode 325 of the second light-emitting portion 32c is directly electrically connected to the second node N2.

Based on the arrangement of the light-emitting portions 32 of the LED chip 3, in some examples, as shown in FIG. 5, the light-emitting control circuit 2 may include a first transistor T1 and a second transistor T2. The first transistor T1 is, for example, an N-type transistor; and the second transistor T2 is, for example, a P-type transistor.

For example, as shown in FIG. 5, a control electrode of the first transistor T1 is electrically connected to the enable signal terminal EM, a first electrode of the first transistor T1 is electrically connected to the first voltage signal terminal VDD, and a second electrode of the first transistor T1 is electrically connected to a third node N3.

For example, in a case where the enable signal transmitted by the enable signal terminal EM is at a high level, the first transistor T1 may be turned on under control of the enable signal to receive and then transmit the first voltage signal to the third node N3.

For example, as shown in FIG. 5, a control electrode of the second transistor T2 is electrically connected to the first node N1, a first electrode of the second transistor T2 is electrically connected to the third node N3, and a second electrode of the second transistor T2 is electrically connected to the second node N2.

For example, in a case where the voltage of the first node N1 is at a low level, the second transistor T2 may be turned on under control of the voltage of the first node N1 to transmit the first voltage signal from the third node N3 to the second node N2.

In some examples, as shown in FIG. 5, the data writing circuit 1 may include a twelfth transistor T12. The twelfth transistor T12 is, for example, an N-type transistor.

For example, as shown in FIG. 5, a control electrode of the twelfth transistor T12 is electrically connected to the first scanning signal terminal Gate1, a first electrode of the twelfth transistor T12 is electrically connected to the data signal terminal Data, and a second electrode of the twelfth transistor T12 is electrically connected to the first node N1.

For example, in a case where the first scanning signal transmitted by the first scanning signal terminal Gate1 is at a high level, the twelfth transistor T12 may be turned on under control of the first scanning signal to receive and then transmit the data signal to the first node N1, so as to charge the first node N1.

Figure 4:
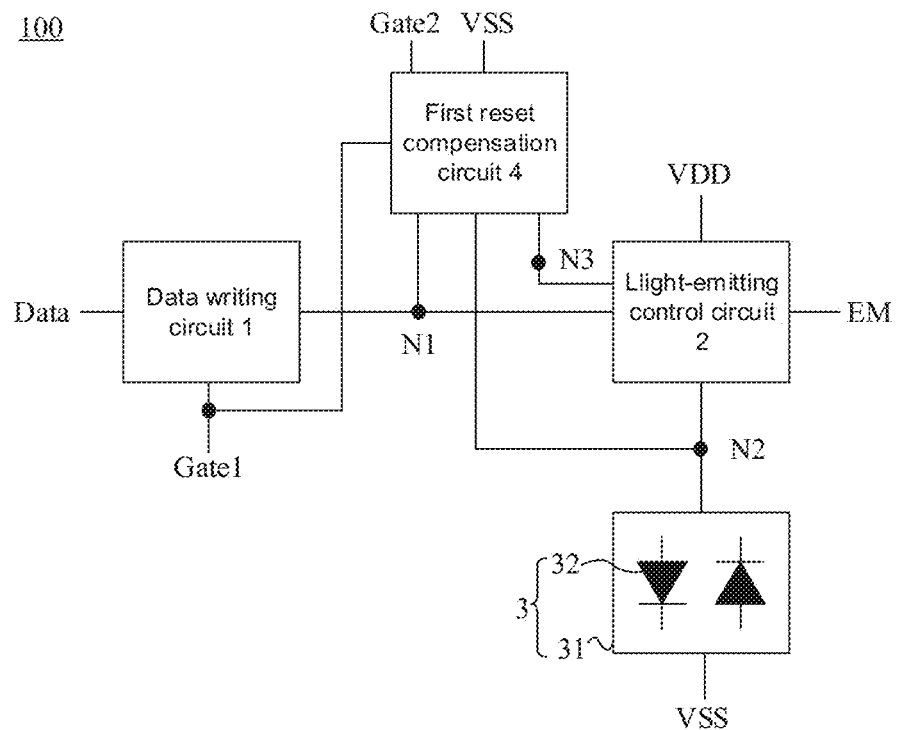
FIG. 4 is a structural diagram of another pixel driving circuit, in accordance with some embodiments of the present disclosure.

In addition, in some examples, as shown in FIGS. 4 and 5, the pixel driving circuit 100 may further include a first reset compensation circuit 4. The first reset compensation circuit 4 is electrically connected to the first scanning signal terminal Gate1, a second scanning signal terminal Gate2, the first node N1, the second node N2, the third node N3 and the second voltage signal terminal VSS. The first reset compensation circuit 4 is configured to, under control of the first scanning signal and a second scanning signal received at the second scanning signal terminal Gate2, reset the pixel driving circuit 100 and compensate for a threshold voltage of the second transistor T2.

By resetting the pixel driving circuit 100 and compensating for the threshold voltage of the second transistor T2, it is beneficial to enable the second transistor T2 in the light-emitting control circuit 2 to be turned on well in a corresponding period of time. As a result, it is beneficial to enable the second transistor T2 to transmit the first voltage signal without loss, thereby accurately controlling the light-emitting state of the first light-emitting portion 32b or the second light-emitting portion 32c.

In some examples, as shown in FIG. 5, the first reset compensation circuit 4 may include a third transistor T3, a fourth transistor T4, a fifth transistor T5, a sixth transistor T6 and a first capacitor C1. The third transistor T3 and the fourth transistor T4 are, for example, N-type transistors; and the fifth transistor T5 and the sixth transistor T6 are, for example, P-type transistors.

For example, as shown in FIG. 5, a control electrode of the third transistor T3 is electrically connected to the first scanning signal terminal Gate1, a first electrode of the third transistor T3 is electrically connected to the second voltage signal terminal VSS, and a second electrode of the third transistor T3 is electrically connected to a fourth node N4.

For example, in a case where the first scanning signal is at the high level and the second voltage signal is at the low level, the third transistor T3 may be turned on under control of the first scanning signal to receive and then transmit the second voltage signal to the fourth node N4, so as to discharge and reset the fourth node N4.

For example, as shown in FIG. 5, a control electrode of the fourth transistor T4 is electrically connected to the second scanning signal terminal Gate2, a first electrode of the fourth transistor T4 is electrically connected to the third node N3, and a second electrode of the fourth transistor T4 is electrically connected to a fifth node N5.

For example, in a case where the second scanning signal is at a high level, the fourth transistor T4 may be turned on under control of the second scanning signal to transmit a signal from the third node N3 to the fifth node N5.

For example, as shown in FIG. 5, a control electrode of the fifth transistor T5 is electrically connected to the second scanning signal terminal Gate2, a first electrode of the fifth transistor T5 is electrically connected to the second node N2, and a second electrode of the fifth transistor T5 is electrically connected to the fifth node N5.

For example, in a case where the second scanning signal is at a low level, the fifth transistor T5 may be turned on under control of the second scanning signal to transmit a signal from the second node N2 to the fifth node N5.

For example, as shown in FIG. 5, a control electrode of the sixth transistor T6 is electrically connected to the first scanning signal terminal Gate1, a first electrode of the sixth transistor T6 is electrically connected to the fourth node N4, and a second electrode of the sixth transistor T6 is electrically connected to the first node N1.

For example, in a case where the first scanning signal is at a low level, the sixth transistor T6 may be turned on under control of the first scanning signal to transmit a signal from the fourth node N4 to the first node N1.

For example, as shown in FIG. 5, a first terminal of the first capacitor C1 is electrically connected to the fourth node N4, and a second terminal of the first capacitor C1 is electrically connected to the fifth node N5. After the fourth node N4 is reset, a voltage difference between the fourth node N4 and the fifth node N5 remains substantially unchanged.

Figure 8:
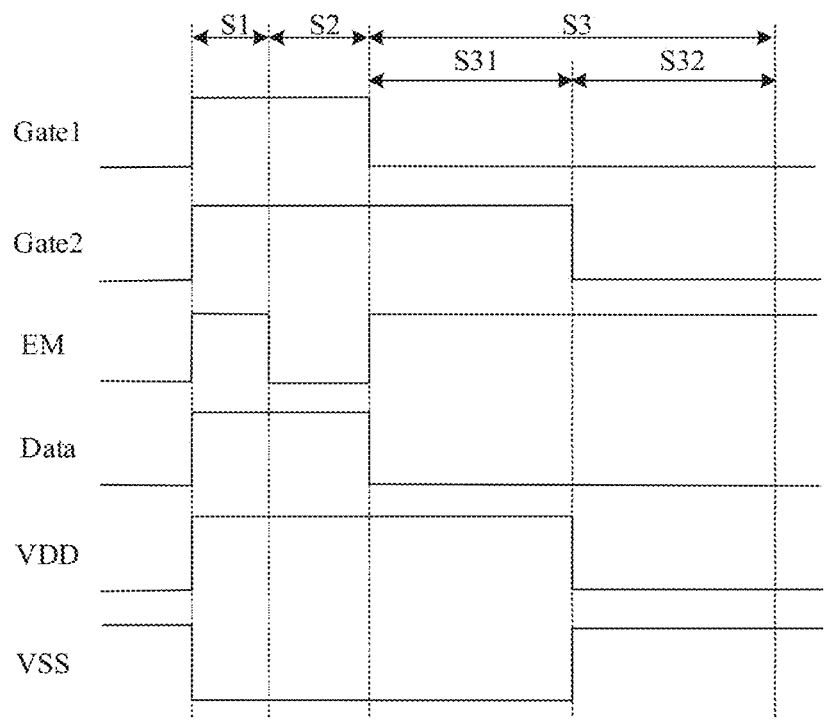
FIG. 8 is a timing control diagram corresponding to the pixel driving circuit shown in FIG. 5, in accordance with some embodiments of the present disclosure.
Figure 9:
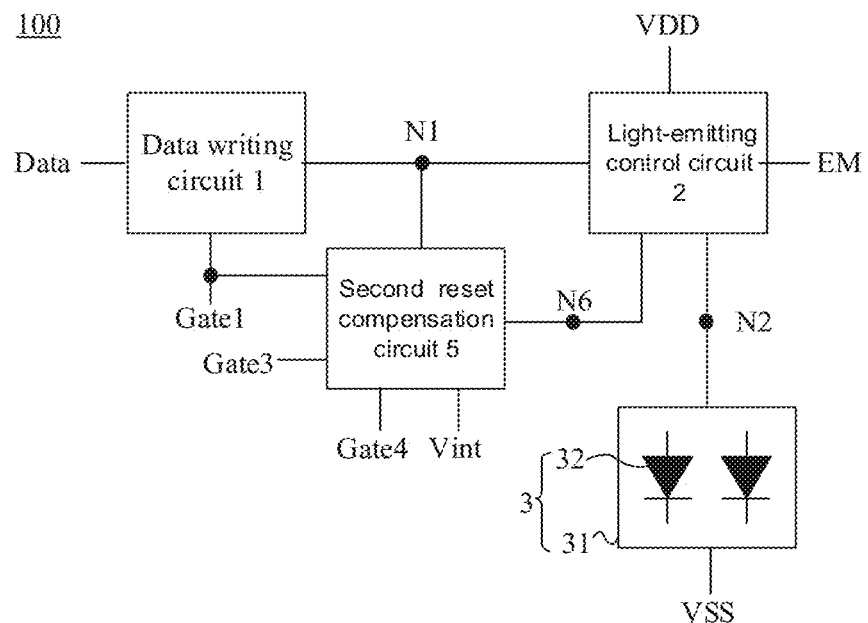
FIG. 9 is a structural diagram of yet another pixel driving circuit, in accordance with some embodiments of the present disclosure.

A method for driving the pixel driving circuit will be schematically described below with reference to the structure of the pixel driving circuit shown in FIG. 5 and the timing diagram shown in FIG. 8.

In some examples, in a display phase of a frame, the method for driving the pixel driving circuit includes: a data writing phase S1, a compensation phase S2 and a light-emitting phase S3. The light-emitting phase S3 includes, for example, a first light-emitting phase S31 and a second light-emitting phase S32.

In the data writing phase S1, the first scanning signal, the second scanning signal, the enable signal, the data signal and the first voltage signal each are at a high level, and the second voltage signal is at a low level.

In response to the first scanning signal received at the first scanning signal terminal Gate1, the twelfth transistor T12 in the data writing circuit 1 is turned on to transmit the data signal received at the data signal terminal Data to the first node N1. Since the data signal is at the high level, the first node N1 may be charged by using the data signal, so that the voltage of the first node N1 is at a high level.

In addition, in the data writing phase S1, the third transistor T3 in the first reset compensation circuit 4 is turned on under the control of the first scanning signal to receive and then transmit the low-level second voltage signal to the fourth node N4, so as to reset the fourth node N4. The fourth transistor T4 in the first reset compensation circuit 4 is turned on under the control of the second scanning signal, and the first transistor T1 in the light-emitting control circuit 2 is turned on under the control of the enable signal, so that the first transistor T1 may receive and then transmit the high-level first voltage signal to the third node N3, and the fourth transistor T4 may transmit the first voltage signal from the third node N3 to the fifth node N5 to reset the fifth node N5. That is, the first capacitor C1 is also reset in the data writing phase S1.

In the compensation phase S2, the first scanning signal and the second scanning signal each are at a high level, the enable signal is at a low level, the data signal and the first voltage signal each are at a high level, and the second voltage signal is at a low level.

The third transistor T3 and the fourth transistor T4 in the first reset compensation circuit 4 remain at an on state, so that the fifth node N5 leaks current. As a result, a voltage value of the fifth node N5 drops from a voltage value of the first voltage signal to a difference between $V_{Data}$ and $V_{th\_tft2}$ ($V_{Data}-V_{th\_tft2}$), where $V_{Data}$ represents a voltage of the data signal, and $V_{th\_tft2}$ represents the threshold voltage of the second transistor T2.

In the first light-emitting phase S31 of the light-emitting phase S3, the first scanning signal is at a low level, the second scanning signal and the enable signal each are at a high level, the data signal is at a low level, the first voltage signal is at a high level, and the second voltage signal is at a low level.

The fourth transistor T4 in the first reset compensation circuit 4 remains at the on state, and the sixth transistor T6 in the first reset compensation circuit 4 is turned on under the control of the first scanning signal.

The first transistor T1 in the light-emitting control circuit 2 is turned on under the control of the enable signal. In this case, a voltage difference Vgs between the control electrode and the first electrode of the second transistor T2 in the light-emitting control circuit 2 is a difference between a voltage of the fourth node N4 and a voltage of the fifth node N5 (i.e., $Vgs=V_{SS}-(V_{Data}-V_{th\_tft2})$). In this case, the second transistor T2 in the light-emitting control circuit 2 is turned on. As a result, the light-emitting control circuit 2 transmits the first voltage signal received at the first voltage signal terminal VDD to the second node N2.

Since the first voltage signal is at the high level and the second voltage signal is at the low level, with the cooperation of the first voltage signal and the second voltage signal, the first light-emitting portion 32b in the LED chip 3 may emit light and the second light-emitting portion 32c in the LED chip 3 may be in an off state.

In a case where there is one first light-emitting portion 32b, the first light-emitting portion 32b may be driven to emit light; and in a case where there are at least two first light-emitting portions 32b, the at least two first light-emitting portions 32b may be driven to emit light simultaneously.

Figure 6:
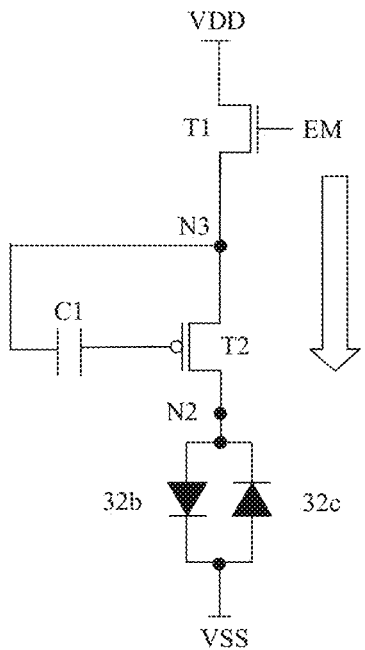
FIG. 6 is an equivalent circuit diagram of the pixel driving circuit shown in FIG. 5 in a case of emitting light.

In an example where there is one first light-emitting portion 32b, an equivalent circuit diagram of the pixel driving circuit 100 may be as shown in FIG. 6, and a current I flowing through the first light-emitting portion 32b is:

$$I = \frac{1}{2}k(Vgs - V_{th\_tft2})^2 = \frac{1}{2}k(Vss - V_{Data})^2.$$

In the second light-emitting phase S32 of the light-emitting phase S3, the first scanning signal and the second scanning signal each are at a low level, the enable signal is at a high level, the data signal and the first voltage signal each are at a low level, and the second voltage signal is at a high level.

The sixth transistor T6 in the first reset compensation circuit 4 remains at an on state, and the fifth transistor T5 in the first reset compensation circuit 4 is turned on under the control of the second scanning signal.

The first transistor T1 in the light-emitting control circuit 2 remains at an on state. Since the voltage difference Vgs between the control electrode and the first electrode of the second transistor T2 in the light-emitting control circuit 2 remains unchanged, the second transistor T2 remains at the on state.

Since the first voltage signal is at the low level and the second voltage signal is at the high level, with the cooperation of the first voltage signal and the second voltage signal, the second light-emitting portion 32c in the LED chip 3 may emit light, and the first light-emitting portion 32b in the LED chip 3 may be in an off state.

In a case where there is one second light-emitting portion 32c, the second light-emitting portion 32c may be driven to emit light; and in a case where there are at least two second light-emitting portions 32c, the at least two second light-emitting portions 32c may be driven to emit light simultaneously.

Figure 7:
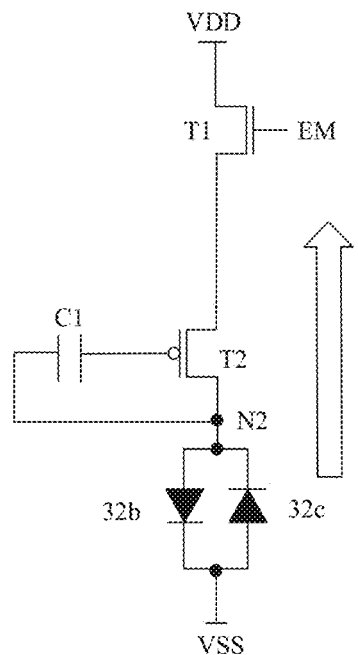
FIG. 7 is another equivalent circuit diagram of the pixel driving circuit shown in FIG. 5 in a case of emitting light.

In an example where there is one second light-emitting portion 32c, the equivalent circuit diagram of the pixel driving circuit 100 may be as shown in FIG. 7, and a current I flowing through the second light-emitting portion 32c is:

$$I = \frac{1}{2}k(Vss - V_{Data})^2.$$

In the light-emitting phase S3, the current flowing through the first light-emitting portion 32b or the second light-emitting portion 32c is independent of the threshold voltage of the second transistor T2. That is, by providing the first reset compensation circuit 4, it may be possible to compensate for the threshold voltage of the second transistor T2, which avoids affecting the light-emitting state of the first light-emitting portion 32b or the second light-emitting portion 32c, improves display stability of the LED chip 3, and avoids a problem of uneven and/or unstable display brightness.

As can be seen from the above, during display of the pixel driving circuit 100, the plurality of light-emitting portions 32 in the LED chip 3 may be driven to emit light in different periods of time respectively, or at least two light-emitting portions 32 in the LED chip 3 may be driven to emit light in the same period of time.

Figure 10:
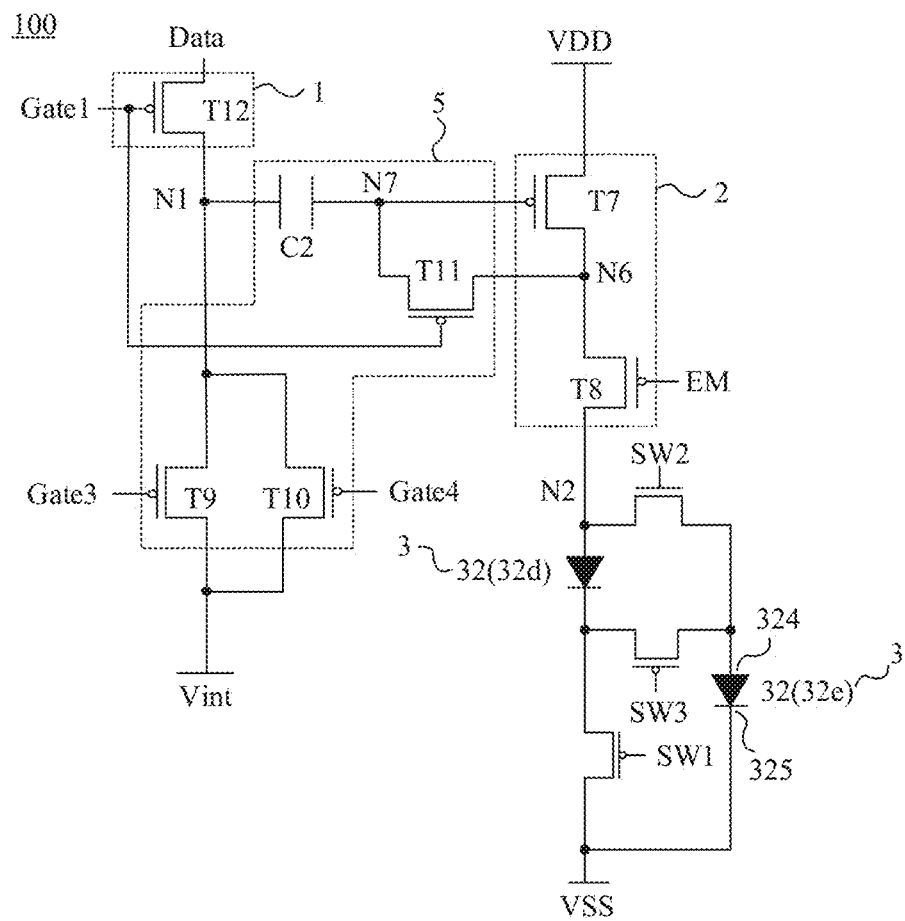
FIG. 10 is a circuit diagram of another pixel driving circuit, in accordance with some embodiments of the present disclosure.
Figure 11:
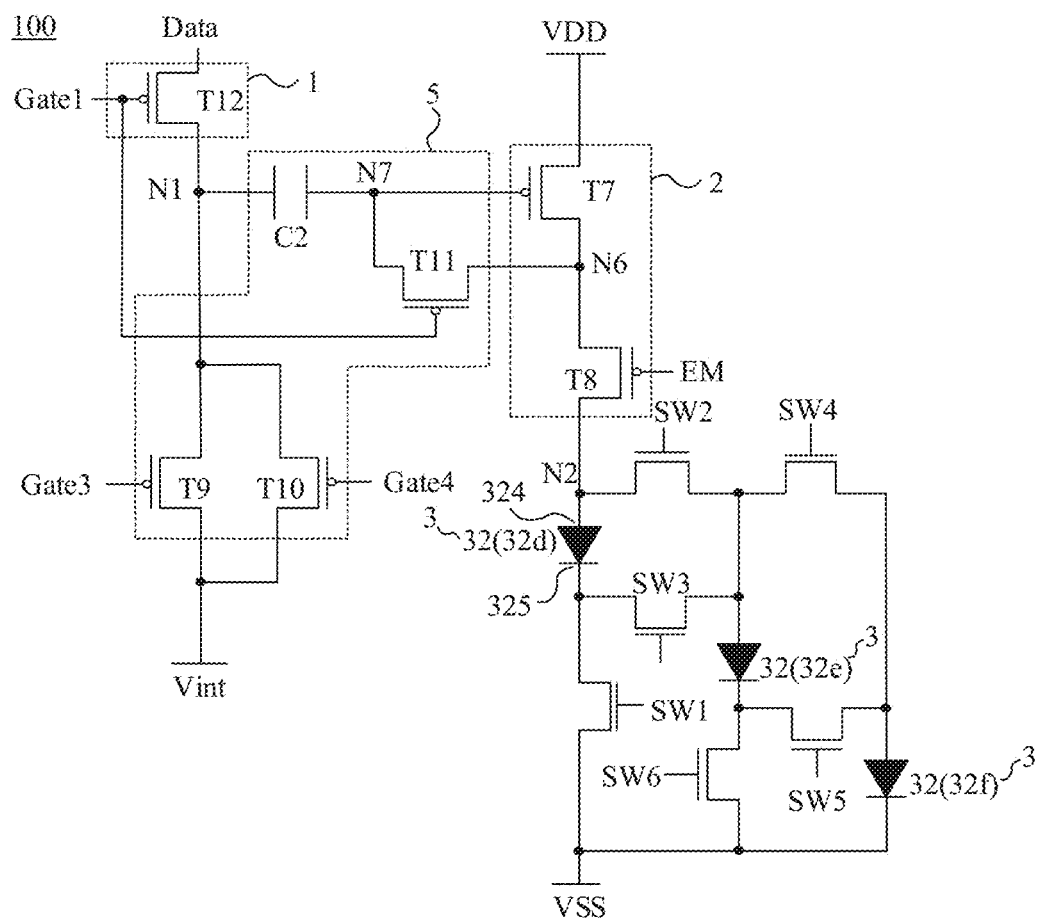
FIG. 11 is a circuit diagram of yet another pixel driving circuit, in accordance with some embodiments of the present disclosure.
Figure 12:
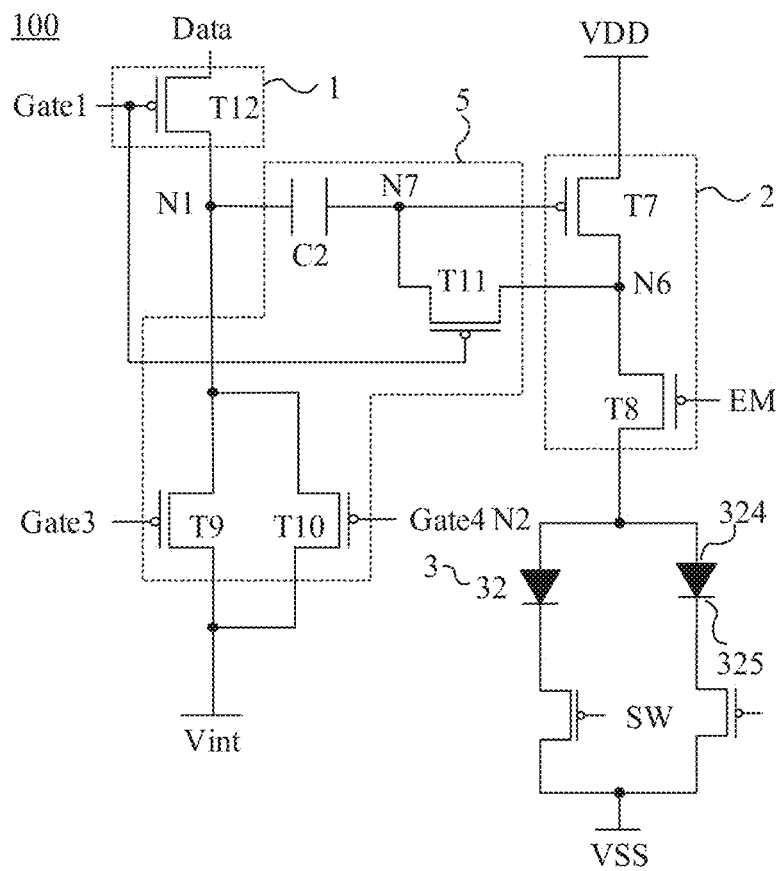
FIG. 12 is a circuit diagram of yet another pixel driving circuit, in accordance with some embodiments of the present disclosure.

In some embodiments, as shown in FIGS. 10 to 12, the pixel driving circuit 100 further includes a plurality of switching transistors SW. In the plurality of light-emitting portions 32 included in the LED chip 3, the first bonding electrode 324 of a light-emitting portion 32 is electrically connected to the second node N2 through at least one switching transistor SW; and/or the second bonding electrode 325 of a light-emitting portion 32 is electrically connected to the second voltage signal terminal VSS through at least one switching transistor SW.

For example, the first bonding electrode 324 of a light-emitting portion 32 may be electrically connected to the second node N2 through one or more switching transistors SW, and the second bonding electrode 325 of the light-emitting portion 32 may be electrically connected to the second voltage signal terminal VSS directly; or the first bonding electrode 324 of the light-emitting portion 32 may be electrically connected to the second node N2 directly, and the second bonding electrode 325 of the light-emitting portion 32 may be electrically connected to the second voltage signal terminal VSS through one or more switching transistors SW; or the first bonding electrode 324 of the light-emitting portion 32 may be electrically connected to the second node N2 through one or more switching transistors SW, and the second bonding electrode 325 of the light-emitting portion 32 may be electrically connected to the second voltage signal terminal VSS through one or more other switching transistors SW.

In some examples, as shown in FIG. 12, the number of the plurality of switching transistors SW is equal to the number of the plurality of light-emitting portions 32 included in the LED chip 3. In this case, the first bonding electrode 324 of each light-emitting portion 32 may be electrically connected to the second node N2 directly, and the second bonding electrode 325 of the light-emitting portion 32 may be electrically connected to the second voltage signal terminal VSS through a switching transistor SW.

In this example, at least two light-emitting portions 32 in the plurality of light-emitting portions 32 may share a same first bonding electrode 324. In this case, first semiconductor layers 321 of the at least two light-emitting portions 32 may be of a one-piece structure.

By arranging the switching transistor SW between each light-emitting portion 32 and the second voltage signal terminal VSS, it may be possible to control an on state of a corresponding light-emitting portion 32 by using the switching transistor SW, and thus independently control on states of the plurality of light-emitting portions 32 by using different switching transistors SW. As a result, the plurality of light-emitting portions 32 may emit light in different periods of time respectively, or the at least two light-emitting portions 32 may emit light in the same period of time.

In some examples, as shown in FIGS. 10 and 11, the number of the plurality of switching transistors SW is greater than the number of the plurality of light-emitting portions 32 included in the LED chip 3. In this case, the first bonding electrode 324 of a light-emitting portion 32 may be electrically connected to the second node N2 directly, and electrically connected to the first bonding electrode 324 of another light-emitting portion 32 through at least one switching transistor SW. The second bonding electrode 325 of the light-emitting portion may be electrically connected to the second voltage signal terminal VSS through at least one switching transistor SW, and electrically connected to the first bonding electrode 324 of the another light-emitting portion 32 through at least one switching transistor SW. The second bonding electrode 325 of the another light-emitting portion 32 may be electrically connected to the second voltage signal terminal VSS directly.

The plurality of light-emitting portions 32 are, for example, arranged independently of each other, each light-emitting portion 32 includes the first bonding electrode 324 and the second bonding electrode 325, and no bonding electrode is shared by different light-emitting portions 32.

By setting connection relationships between different light-emitting portions 32 and the second node N2 and between different light-emitting portions 32 and the second voltage signal terminal VSS by using switching transistors SW, it may be possible to independently control the on state of each light-emitting portion 32, and thus independently control the on states of the plurality of light-emitting portions 32 by using different switching transistors SW. As a result, the plurality of light-emitting portions 32 may emit light in different periods of time respectively, or the at least two light-emitting portions 32 may emit light in the same period of time.

For example, as shown in FIG. 10, the number of switching transistors SW is three, and the number of light-emitting portions 32 is two. The three switching transistors SW may, for example, be referred to as a first switching transistor SW1, a second switching transistor SW2 and a third switching transistor SW3, respectively. The two light-emitting portions 32 may, for example, be referred to as a light-emitting portion 32d and a light-emitting portion 32e, respectively.

For example, as shown in FIG. 10, the first bonding electrode 324 of the light-emitting portion 32d is electrically connected to the second node N2 directly; and the second bonding electrode 325 of the light-emitting portion 32d is electrically connected to the second voltage signal terminal VSS through the first switching transistor SW1, and is electrically connected to the first bonding electrode 324 of the light-emitting portion 32e through the third switching transistor SW3. The first bonding electrode 324 of the light-emitting portion 32e is further electrically connected to the second node N2 through the second switching transistor SW2, and the second bonding electrode 325 of the light-emitting portion 32e may be electrically connected to the second voltage signal terminal VSS directly.

Optionally, in a case where the first switching transistor SW1 is turned on, the second switching transistor SW2 and the third switching transistor SW3 are turned off, the light-emitting portion 32d emits light. In a case where the first switching transistor SW1 is turned off, the second switching transistor SW2 is turned on, and the third switching transistor SW3 is turned off, the light-emitting portion 32e emits light.

In a case where the first switching transistor SW1 and the second switching transistor SW2 are turned off, and the third switching transistor SW3 is turned on, the light-emitting portion 32d and the light-emitting portion 32e emit light simultaneously and they are arranged in series. In a case where the first switching transistor SW1 and the second switching transistor SW2 are turned on, and the third switching transistor SW3 is turned off, the light-emitting portion 32d and the light-emitting portion 32e emit light simultaneously, and they are arranged in parallel.

By adjusting on states of the first switching transistor SW1, the second switching transistor SW2 and the third switching transistor SW3, it may be possible to independently control the two light-emitting portions 32. For example, one of the two light-emitting portions 32 may be driven to emit light, or the two light-emitting portions 32 may be driven to emit light alternately, or the two light-emitting portions 32 may be driven to emit light simultaneously. Since there are various light-emitting forms, a light-emitting form may be overall determined according to an actual driving capability of the pixel driving circuit 100 and a power consumption requirement.

For example, as shown in FIG. 11, the number of switching transistors SW is six, and the number of light-emitting portions 32 is three. The six switching transistors SW may, for example, be referred to as a first switching transistor SW1, a second switching transistor SW2, a third switching transistor SW3, a fourth switching transistor SW4, a fifth switching transistor SW5 and a sixth switching transistor SW6, respectively. The three light-emitting portions 32 may, for example, referred to as a light-emitting portion 32d, a light-emitting portion 32e and a light-emitting portion 32f, respectively.

For example, as shown in FIG. 11, the first bonding electrode 324 of the light-emitting portion 32d is electrically connected to the second node N2 directly; and the second bonding electrode 325 of the light-emitting portion 32d is electrically connected to the second voltage signal terminal VSS through the first switching transistor SW1, and is electrically connected to the first bonding electrode 324 of the light-emitting portion 32e through the third switching transistor SW3. The first bonding electrode 324 of the light-emitting portion 32e is further electrically connected to the second node N2 through the second switching transistor SW2. The second bonding electrode 325 of the light-emitting portion 32e may be electrically connected to the second voltage signal terminal VSS through the sixth switching transistor SW6, and electrically connected to the first bonding electrode 324 of the light-emitting portion 32f through the fifth switching transistor SW5. The first bonding electrode 324 of the light-emitting portion 32f is further electrically connected to the second node N2 through the fourth switching transistor SW4 and the second switching transistor SW2. The second bonding electrode 325 of the light-emitting portion 32f may be electrically connected to the second voltage signal terminal VSS directly.

Optionally, in a case where the first switching transistor SW1 is turned on and remaining switching transistors SW are turned off, the light-emitting portion 32d emits light. In a case where the second switching transistor SW2 and the sixth switching transistor SW6 are turned on, and remaining switching transistors SW are turned off, the light-emitting portion 32e emits light. In a case where the second switching transistor SW2 and the fourth switching transistor SW4 are turned on, and remaining switching transistors SW are turned off, the light-emitting portion 32f emits light.

In a case where the third switching transistor SW3 and the sixth switching transistor SW6 are turned on, and remaining switching transistors SW are turned off, the light-emitting portion 32d and the light-emitting portion 32e emit light simultaneously, and they are arranged in series. In a case where the first switching transistor SW1, the second switching transistor SW2 and the sixth switching transistor SW6 are turned on, and remaining switching transistors SW are turned off, the light-emitting portion 32d and the light-emitting portion 32e emit light simultaneously, and they are arranged in parallel. Of course, by adjusting on states of different switching transistors SW, the light-emitting portion 32d and the light-emitting portion 32f may emit light simultaneously, and they may be arranged in series or in parallel; and by adjusting the on states of different switching transistors SW, the light-emitting portion 32e and the light-emitting portion 32f may emit light simultaneously, and they may be arranged in series or in parallel. Details will not be repeated here.

In a case where the third switching transistor SW3 and the fifth switching transistor SW5 are turned on, and remaining switching transistors SW are turned off, the light-emitting portion 32d, the light-emitting portion 32e and the light-emitting portion 32f emit light simultaneously, and they are arranged in series. In a case where the first switching transistor SW1, the second switching transistor SW2, the fourth switching transistor SW4 and the sixth switching transistor SW6 are turned on, and remaining switching transistors SW are turned off, the light-emitting portion 32d, the light-emitting portion 32e and the light-emitting portion 32f emit light simultaneously, and they are arranged in parallel. In a case where the second switching transistor SW2, the third switching transistor SW3, the fourth switching transistor SW4 and the sixth switching transistor SW6 are turned on, and remaining switching transistors SW are turned off, the light-emitting portion 32d, the light-emitting portion 32e and the light-emitting portion 32f emit light simultaneously, the light-emitting portion 32d and the light-emitting portion 32e are arranged in series, the light-emitting portion 32d and the light-emitting portion 32f are arranged in parallel, and the light-emitting portion 32e and the light-emitting portion 32f are arranged in parallel. Of course, in a case where the light-emitting portion 32d, the light-emitting portion 32e and the light-emitting portion 32f emit light simultaneously, by adjusting the on states of different switching transistors SW, the light-emitting portion 32d and the light-emitting portion 32f may be arranged in series, the light-emitting portion 32d and the light-emitting portion 32e are arranged in parallel, and the light-emitting portion 32e and the light-emitting portion 32f are arranged in parallel; or the light-emitting portion 32e and the light-emitting portion 32f may be arranged in series, the light-emitting portion 32d and the light-emitting portion 32e are arranged in parallel, and the light-emitting portion 32d and the light-emitting portion 32f are arranged in parallel. Details will not be repeated here.

By adjusting the on states of different switching transistors SW, it may be possible to independently control the light-emitting states of different light-emitting portions 32. Since there are various light-emitting forms, a light-emitting form may be overall determined according to the actual driving capability of the pixel driving circuit 100 and the power consumption requirement.

Based on the arrangement of the light-emitting portions 32 in the LED chip 3, in some examples, as shown in FIGS. 10 to 12, the light-emitting control circuit 2 may include a seventh transistor T7 and an eighth transistor T8. The seventh transistor T7 and the eighth transistor T8 are, for example, F-type transistors.

For example, as shown in FIGS. 10 to 12, a control electrode of the seventh transistor T7 is electrically connected to the first node N1, a first electrode of the seventh transistor T7 is electrically connected to the first voltage signal terminal VDD, and a second electrode of the seventh transistor T7 is electrically connected to a sixth node N6.

For example, in the case where the voltage of the first node N1 is at the low level, the seventh transistor T7 may be turned on under control of the voltage of the first node N1 to receive and then transmit the first voltage signal to the sixth node N6.

For example, as shown in FIGS. 10 to 12, a control electrode of the eighth transistor T8 is electrically connected to the enable signal terminal EM, a first electrode of the eighth transistor T8 is electrically connected to the sixth node N6, and a second electrode of the eighth transistor T8 is electrically connected to the second node N2.

For example, in the case where the enable signal transmitted by the enable signal terminal EM is at the low level, the eighth transistor T8 may be turned on under control of the enable signal to transmit the first voltage signal from the sixth node N6 to the second node N2.

In some examples, as shown in FIGS. 10 to 12, the data writing circuit 1 may include a twelfth transistor T12. The twelfth transistor T12 is, for example, a P-type transistor.

For example, as shown in FIGS. 10 to 12, a control electrode of the twelfth transistor T12 is electrically connected to the first scanning signal terminal Gate1, a first electrode of the twelfth transistor T12 is electrically connected to the data signal terminal Data, and a second electrode of the twelfth transistor T12 is electrically connected to the first node N1.

For example, in the case where the first scanning signal transmitted by the first scanning signal terminal Gate1 is at the low level, the twelfth transistor T12 may be turned on under control of the first scanning signal to receive and then transmit the data signal to the first node N1, so as to charge the first node N1.

In addition, in some examples, as shown in FIGS. 9 to 12, the pixel driving circuit 100 may further include a second reset compensation circuit 5. The second reset compensation circuit 5 is electrically connected to the first scanning signal terminal Gate1, the first node N1 and the sixth node N6. The second reset compensation circuit 5 is configured to compensate for a threshold voltage of the seventh transistor T7 in response to the first scanning signal.

For example, as shown in FIGS. 9 to 12, the second reset compensation circuit 5 may be further electrically connected to an initial signal terminal Vint, and at least one of a third scanning signal terminal Gate3 and a fourth scanning signal terminal Gate4. The second reset compensation circuit 5 is further configured to, in response to a third scanning signal received at the third scanning signal terminal Gate3 or a fourth scanning signal received at the fourth scanning signal terminal Gate4, transmit an initial signal received at the initial signal terminal Vint to the first node N1 to reset the first node N1.

For example, in a case where the second reset compensation circuit 5 is electrically connected to the third scanning signal terminal Gate3, the second reset compensation circuit 5 is configured to, in response to the third scanning signal received at the third scanning signal terminal Gate3, transmit the initial signal received at the initial signal terminal Vint to the first node N1 to reset the first node N1. In a case where the second reset compensation circuit 5 is electrically connected to the fourth scanning signal terminal Gate4, the second reset compensation circuit 5 is configured to, in response to the fourth scanning signal received at the fourth scanning signal terminal Gate4, transmit the initial signal received at the initial signal terminal Vint to the first node N1 to reset the first node N1.

By resetting the first node N1 and compensating for the threshold voltage of the seventh electrode T7, it is beneficial to enable the seventh electrode T7 in the light-emitting control circuit 2 to be turned on well in a corresponding period of time, and it is beneficial to enable the seventh electrode T7 to transmit the first voltage signal without loss, thereby accurately controlling the light-emitting states of the light-emitting portions 32.

In some examples, as shown in FIGS. 10 to 12, in the case where the second reset compensation circuit 5 is electrically connected to the third scanning signal terminal Gate3, the second reset compensation circuit 5 includes a ninth transistor T9. The ninth transistor T9 is, for example, a P-type transistor.

For example, as shown in FIGS. 10 to 12, a control electrode of the ninth transistor T9 is electrically connected to the third scanning signal terminal Gate3, a first electrode of the ninth transistor T9 is electrically connected to the initial signal terminal Vint, and a second electrode of the ninth transistor T9 is electrically connected to the first node N1.

For example, in a case where the third scanning signal is at a low level, the ninth transistor T9 may be turned on under control of the third scanning signal to receive and then transmit the initial signal to the first node N1, so as to reset the first node N1.

In some examples, as shown in FIGS. 10 to 12, in the case where the second reset compensation circuit 5 is electrically connected to the fourth scanning signal terminal Gate4, the second reset compensation circuit 5 includes a tenth transistor T10. The tenth transistor T10 is, for example, a P-type transistor.

For example, as shown in FIGS. 10 to 12, a control electrode of the tenth transistor T10 is electrically connected to the fourth scanning signal terminal Gate4, a first electrode of the tenth transistor T10 is electrically connected to the initial signal terminal Vint, and a second electrode of the tenth transistor T10 is electrically connected to the first node N1.

For example, in a case where the fourth scanning signal is at a low level, the tenth transistor T10 may be turned on under control of the fourth scanning signal to receive and then transmit the initial signal to the first node N1, so as to reset the first node N1.

In some examples, as shown in FIGS. 10 to 12, the second reset compensation circuit 5 further includes an eleventh transistor T11 and a second capacitor C2. The eleventh transistor T11 is, for example, a P-type transistor.

For example, as shown in FIGS. 10 to 12, a control electrode of the eleventh transistor T11 is electrically connected to the first scanning signal terminal Gate1, a first electrode of the eleventh transistor T11 is electrically connected to a seventh node N7, and a second electrode of the eleventh transistor T11 is electrically connected to the sixth node N6.

For example, in the case where the first scanning signal is at the low level, the eleventh transistor T11 may be turned on under control of the first scanning signal to transmit a signal from the seventh node N7 to the sixth node.

For example, as shown in FIGS. 10 to 12, a first terminal of the second capacitor C2 is electrically connected to the first node N1, and a second terminal of the second capacitor C2 is electrically connected to the seventh node N7. The control electrode of the seventh transistor T7 is electrically connected to the first node N1 through the second capacitor C2.

Figure 13:
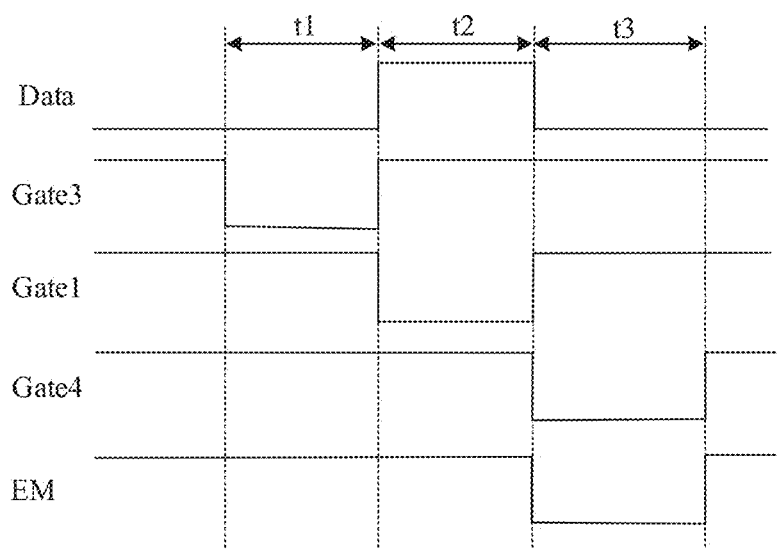
FIG. 13 is a timing control diagram corresponding to the pixel driving circuits shown in FIGS. 10 and 11, in accordance with some embodiments of the present disclosure.

A method for driving the pixel driving circuit will be schematically described below with reference to the structure of the pixel driving circuit shown in FIGS. 10 to 12 and the timing diagram shown in FIG. 13.

In some examples, in a display phase of a frame, the method for driving the pixel driving circuit includes a reset phase t1, a data writing phase t2 and a light-emitting phase t3.

In the reset phase t1 the first scanning signal is at a high level, the third scanning signal is at a low level, the fourth scanning signal and the enable signal each are at a high level, the data signal is at a low level, the first voltage signal is at a high level, and the second voltage signal is at a low level.

The ninth transistor T9 in the second reset compensation circuit 5 is turned on under the control of the third scanning signal to receive and then transmit the initial signal to the first node N1, so as to reset the first node N1.

In the data writing phase t2, the first scanning signal is at a low level, the third scanning signal, the fourth scanning signal, the enable signal, the data signal and the first voltage signal each are at a high level, and the second voltage signal is at a low level.

In response to the first scanning signal received at the first scanning signal terminal Gate1, the twelfth transistor T12 in the data writing circuit 1 is turned on to transmit the data signal received at the data signal terminal Data to the first node N1. Since the data signal is at the high level, the first node N1 may be charged by using the data signal, so that the voltage of the first node N1 is at the high level.

In addition, in the data writing phase t2, the eleventh transistor T11 in the second reset compensation circuit 5 is turned on under the control of the first scanning signal to compensate for the threshold voltage of the seventh transistor T7. In this case, a voltage of the seventh node N7 is a Sum of $V_{DD}$ and $V_{th\_tft7}$ ($V_{DD}+V_{th\_tft7}$), where $V_{DD}$ represents the voltage of the first voltage signal, and $V_{th\_tft7}$ represents the threshold voltage of the seventh transistor T7.

In the light-emitting phase t3, the first scanning signal and the third scanning signal each are at a high level, the fourth scanning signal, the enable signal and the data signal each are at a low level, the first voltage signal is at a high level, and the second voltage signal is at a low level.

The eighth transistor T8 in the light-emitting control circuit 2 is turned on under the control of the enable signal.

The tenth transistor T10 in the second reset compensation circuit 5 is turned on under the control of the fourth scanning signal to receive and then transmit the initial signal to the first node N1, so that the voltage of the first node N1 jumps from $V_{Data}$ to $V_{int}$. In this case, the voltage of the seventh node N7 jumps to $V_{DD} V_{th\_tft7}-(V_{Data}-V_{int})$; and the seventh transistor T7 is in a saturated state. A voltage difference Vsg between the first electrode and the control electrode of the seventh transistor T7 is a difference between the voltage of the first voltage signal and the voltage of the first node N7 (i.e., $Vsg=V_{DD}-[V_{DD}+V_{th\_tft7}-(V_{Data}-V_{int})]=V_{Data}-V_{int}-V_{th\_tft7}$). The light-emitting control circuit 2 transmits the first voltage signal received at the first voltage signal terminal VOD to the second node N2.

In this example, the first voltage signal is at the high level, and the second voltage signal is at the low level. By controlling the on states of the switching transistors SW, the plurality of light-emitting portions 32 may be driven to emit light in different periods of time respectively, or at least two light-emitting portions 32 may be driven to emit light in the same period of time.

In an example where one of the plurality of light-emitting portions 32 is driven to emit light, the current I flowing through the light-emitting portion 32 is:

$$I=k(Vgs-V_{th\_tft7})^2=k(Vsg+V_{th\_tft7})^2=k(V_{Data}-V_{int})^2.$$

In the light-emitting phase t3, the current flowing through the light-emitting portion 32 is independent of the threshold voltage of the seventh transistor T7. That is, by providing the second reset compensation circuit 5, the threshold voltage of the seventh transistor T7 may be compensated, which avoids affecting the light-emitting state of the light-emitting portion 32, improves the display stability of the LED chip 3, and avoids the problem of uneven and/or unstable display brightness.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A pixel driving circuit, comprising:
   a data writing circuit electrically connected to a first scanning signal terminal, a data signal terminal and a first node, the data writing circuit being configured to transmit a data signal received at the data signal terminal to the first node in response to a first scanning signal received at the first scanning signal terminal;
   a light-emitting control circuit electrically connected to the first node, an enable signal terminal, a first voltage signal terminal and a second node, the light-emitting control circuit being configured to transmit a first voltage signal received at the first voltage signal terminal to the second node under control of a voltage of the first node and an enable signal transmitted by the enable signal terminal;
   a first reset compensation circuit, and
   a light-emitting diode chip electrically connected to the second node and a second voltage signal terminal, wherein
   the light-emitting diode chip includes a plurality of light-emitting portions; the plurality of light-emitting portions include at least one first light-emitting portion and at least one second light-emitting portion;
   a first bonding electrode of a first light-emitting portion in the at least one first light-emitting portion is electrically connected to the second node, and a second bonding electrode of the first light-emitting portion is electrically connected to the second voltage signal terminal;
   a first bonding electrode of a second light-emitting portion in the at least one second light-emitting portion is electrically connected to the second voltage signal terminal, and a second bonding electrode of the second light-emitting portion is electrically connected to the second node;
   the light-emitting diode chip is configured to, with cooperation of the first voltage signal from the second node and a second voltage signal received at the second voltage signal terminal, drive the plurality of light-emitting portions to emit light in different periods of time respectively or drive at least two light-emitting portions in the plurality of light-emitting portions to emit light in a same period of time;
   wherein the light-emitting control circuit includes a first transistor and a second, transistor;
   a control electrode of the first transistor is electrically connected to the enable signal terminal, a first electrode of the first transistor is electrically connected to the first voltage signal terminal, and a second electrode of the first transistor is electrically connected to a third node;
   a control electrode of the second transistor is electrically connected to the first node, a first electrode of the second transistor is electrically connected to the third node, and a second electrode of the second transistor is electrically connected to the second node,
   wherein the first reset compensation circuit is electrically connected to the first scanning signal terminal, a second scanning signal terminal, the first node, the second node, the third node and the second voltage signal terminal; and the first reset compensation circuit is configured to, under control of the first scanning signal and a second scanning signal received at the second scanning signal terminal, reset the pixel driving circuit and compensate for a threshold voltage of the second transistor;
   the first reset compensation circuit includes a third transistor, a fourth transistor, a fifth transistor, a sixth transistor and a first capacitor;
   a control electrode of the third transistor is electrically connected to the first scanning signal terminal, a first electrode of the third transistor is electrically connected to the second voltage signal terminal, and a second electrode of the third transistor is electrically connected to a fourth node;
   a control electrode of the fourth transistor is electrically connected to the second scanning signal terminal, a first electrode of the fourth transistor is electrically connected to the third node, and a second electrode of the fourth transistor is electrically connected to a fifth node;
   a control electrode of the fifth transistor is electrically connected to the second scanning signal terminal, a first electrode of the fifth transistor is electrically connected to the second node, and a second electrode of the fifth transistor is electrically connected to the fifth node;

a control electrode of the sixth transistor is electrically connected to the first scanning signal terminal, a first electrode of the sixth transistor is electrically connected to the fourth node, and a second electrode of the sixth transistor is electrically connected to the first node; and a first terminal of the first capacitor is electrically connected to the fourth node, and a second terminal of the first capacitor is electrically connected to the fifth node.

2. The pixel driving circuit according to claim 1, further comprising a plurality of switching transistors, wherein a first bonding electrode of a light-emitting portion in the plurality of light-emitting portions is electrically connected to the second node through at least one switching transistor in the plurality of switching transistors; and/or a second bonding electrode of the light-emitting portion is electrically connected to the second voltage signal terminal through at least one other switching transistor in the plurality of switching transistors.

3. The pixel driving circuit according to claim 2, wherein a number of the plurality of light-emitting portions is equal to a number of the plurality of switching transistors; and the first bonding electrode of the light-emitting portion is electrically connected to the second node directly, and the second bonding electrode of the light-emitting portion is electrically connected to the second voltage signal terminal through one switching transistor.

4. The pixel driving circuit according to claim 2, wherein a number of the plurality of light-emitting portions is less than a number of the plurality of switching transistors;

a first bonding electrode of one light-emitting portion in the plurality of light-emitting portions is electrically connected to the second node directly, and is electrically connected to a first bonding electrode of another light-emitting portion in the plurality of light-emitting portions through at least one switching transistor in the plurality of switching transistors;

a second bonding electrode of the one light-emitting portion in the plurality of light-emitting portions is electrically connected to the second voltage signal terminal through at least one other switching transistor in the plurality of switching transistors, and is electrically connected to the first bonding electrode of the another light-emitting portion through at least one yet other switching transistor in the plurality of switching transistors; and a second bonding electrode of the another light-emitting portion is electrically connected to the second voltage signal terminal directly.

5. The pixel driving circuit according to claim 2, wherein the light-emitting control circuit includes a seventh transistor and an eighth transistor;

a control electrode of the seventh transistor is electrically connected to the first node, a first electrode of the seventh transistor is electrically connected to the first voltage signal terminal, and a second electrode of the seventh transistor is electrically connected to a sixth node; and a control electrode of the eighth transistor is electrically connected to the enable signal terminal, a first electrode of the eighth transistor is electrically connected to the sixth node, and a second electrode of the eighth transistor is electrically connected to the second node.

6. The pixel driving circuit according to claim 5, further comprising a second reset compensation circuit, wherein the second reset compensation circuit is electrically connected to the first scanning signal terminal, the first node and the sixth node; and the second reset compensation circuit is configured to compensate for a threshold voltage of the seventh transistor in response to the first scanning signal; and the second reset compensation circuit is further electrically connected to an initial signal terminal, and at least one of a third scanning signal terminal and a fourth scanning signal terminal; and the second reset compensation circuit is further configured to, in response to a third scanning signal received at the third scanning signal terminal or a fourth scanning signal received at the fourth scanning signal terminal, transmit an initial signal received at the initial signal terminal to the first node, so as to reset the first node.

7. The pixel driving circuit according to claim 6, wherein the second reset compensation circuit includes an eleventh transistor and a second capacitor;

a control electrode of the eleventh transistor is electrically connected to the first scanning signal terminal, a first electrode of the eleventh transistor is electrically connected to a seventh node, and a second electrode of the eleventh transistor is electrically connected to the sixth node;

a first terminal of the second capacitor is electrically connected to the first node, and a second terminal of the second capacitor is electrically connected to the seventh node; and the control electrode of the seventh transistor is electrically connected to the first node through the second capacitor, wherein in a case where the second reset compensation circuit is electrically connected to the third scanning signal terminal, the second reset compensation circuit further includes a ninth transistor, wherein a control electrode of the ninth transistor is electrically connected to the third scanning signal terminal, a first electrode of the ninth transistor is electrically connected to the initial signal terminal, and a second electrode of the ninth transistor is electrically connected to the first node; and in a case where the second reset compensation circuit is electrically connected to the fourth scanning signal terminal, the second reset compensation circuit further includes a tenth transistor, wherein a control electrode of the tenth transistor is electrically connected to the fourth scanning signal terminal, a first electrode of the tenth transistor is electrically connected to the initial signal terminal, and a second electrode of the tenth transistor is electrically connected to the first node.

8. The pixel driving circuit according to claim 1, wherein the data writing circuit includes a twelfth transistor;

a control electrode of the twelfth transistor is electrically connected to the first scanning signal terminal, a first electrode of the twelfth transistor is electrically connected to the data signal terminal, and a second electrode of the twelfth transistor is electrically connected to the first node.

9. A display substrate, comprising
a substrate; and
a plurality of pixel driving circuits each according to claim 1, the plurality of pixel driving circuits being disposed on a side of the substrate, wherein in the plurality of light-emitting portions included in the light-emitting diode chip in the pixel driving circuit, each light-emitting portion includes a first semiconductor layer, a quantum well layer and a second semiconductor layer that are stacked in sequence;

the first semiconductor layer and the second semiconductor layer have different doping types, the light-emitting portion further includes at least one of a first bonding electrode and a second bonding electrode;

the first bonding electrode is electrically connected to the first semiconductor layer of the light-emitting portion; and the second bonding electrode is electrically connected to the second semiconductor layer of the light-emitting portion.

10. The display substrate according to claim 9, wherein the light-emitting diode chip further includes a base; and
the plurality of light-emitting portions included in the light-emitting diode chip are located on a same side of the base; and/or
first semiconductor layers of at least two light-emitting portions are of a one-piece structure and are electrically connected to a same first bonding electrode.

11. The display substrate according to claim 9, wherein the light-emitting portion includes the first bonding electrode and the second bonding electrode; and
first bonding electrodes included in different light-emitting portions are different, and second bonding electrodes included in different light-emitting portions are different.

12. The display substrate according to claim 9, wherein the light-emitting portion includes a plurality of light-emitting sub-portions arranged in series;
each light-emitting sub-portion includes a first semiconductor sub-layer, a first quantum well sub-layer and a second semiconductor sub-layer that are stacked in sequence;
a first semiconductor sub-layer of a light-emitting sub-portion in a same light-emitting portion is electrically connected to the first bonding electrode of the same light-emitting portion; and
a second semiconductor sub-layer of another light-emitting sub-portion in the same light-emitting portion is electrically connected to the second bonding electrode of the same light-emitting portion.

13. The display substrate according to claim 9, wherein the plurality of light-emitting portions include at least one first light-emitting portion and at least one second light-emitting portion;
a first bonding electrode of a first light-emitting portion in the at least one first light-emitting portion is electrically connected to the second node, and a second bonding electrode of the first light-emitting portion is electrically connected to the second voltage signal terminal;
a first bonding electrode of a second light-emitting portion in the at least one second light-emitting portion is electrically connected to the second voltage signal terminal, and a second bonding electrode of the second light-emitting portion is electrically connected to the second node;
a first semiconductor layer of the first light-emitting portion and a second semiconductor layer of the second light-emitting portion are electrically connected to a second bonding electrode; and a second semiconductor layer of the first light-emitting portion and a first semiconductor layer of the second light-emitting portion are electrically connected to another second bonding electrode.

14. The display substrate according to claim 13, wherein the light-emitting diode chip further includes a plurality of connection portions;
the first semiconductor layer of the first light-emitting portion is electrically connected to the second semiconductor layer of the second light-emitting portion through a connection portion in the plurality of connection portions; and
the first semiconductor layer of the second light-emitting portion is electrically connected to the second semiconductor layer of the first light-emitting portion through another connection portion in the plurality of connection portions.

15. The display substrate according to claim 13, wherein the first light-emitting portion includes a plurality of first light-emitting sub-portions arranged in series, and the second light-emitting portion includes a plurality of second light-emitting sub-portions arranged in series;
each first light-emitting sub-portion includes a third semiconductor sub-layer, a second quantum well sub-layer and a fourth semiconductor sub-layer that are stacked in sequence; and each second light-emitting sub-portion includes a fifth semiconductor sub-layer, a third quantum well sub-layer and a sixth semiconductor sub-layer that are stacked in sequence;
a third semiconductor sub-layer of a first light-emitting sub-portion in the plurality of first light-emitting sub-portions is electrically connected to the second bonding electrode, and is electrically connected to a sixth semiconductor sub-layer of a second light-emitting sub-portion in the plurality of second light-emitting sub-portions; and
a fifth semiconductor sub-layer of another second light-emitting sub-portion in the plurality of second light-emitting sub-portions is electrically connected to the another second bonding electrode, and is electrically connected to a fourth semiconductor sub-layer of another first light-emitting sub-portion in the plurality of first light-emitting sub-portions.

16. A method for driving a pixel driving circuit, the pixel driving circuit comprising:
a data writing circuit electrically connected to a first scanning signal terminal, a data signal terminal and a first node, the data writing circuit being configured to transmit a data signal received at the data signal terminal to the first node in response to a first scanning signal received at the first scanning signal terminal;
a light-emitting control circuit electrically connected to the first node, an enable signal terminal, a first voltage signal terminal and a second node, the light-emitting control circuit being configured to transmit a first voltage signal received at the first voltage signal terminal to the second node under control of a voltage of the first node and an enable signal transmitted by the enable signal terminal;
a first reset compensation circuit, and
a light-emitting diode chip electrically connected to the second node and a second voltage signal terminal, wherein
the light-emitting diode chip includes a plurality of light-emitting portions; the plurality of light-emitting portions include at least one first light-emitting portion and at least one second light-emitting portion;

a first bonding electrode of a first light-emitting portion in the at least one first light-emitting portion is electrically connected to the second node, and a second bonding electrode of the first light-emitting portion is electrically connected to the second voltage signal terminal;

a first bonding electrode of a second light-emitting portion in the at least one second light-emitting portion is electrically connected to the second voltage signal terminal, and a second bonding electrode of the second light-emitting portion is electrically connected to the second node;

the light-emitting diode chip is configured to, with cooperation of the first voltage signal from the second node and a second voltage signal received at the second voltage signal terminal, drive the plurality of light-emitting portions to emit light in different periods of time respectively or drive at least two light-emitting portions in the plurality of light-emitting portions to emit light in a same period of time;

wherein the light-emitting control circuit includes a first transistor and a second transistor;

a control electrode of the first transistor is electrically connected to the enable signal terminal, a first electrode of the first transistor is electrically connected to the first voltage signal terminal, and a second electrode of the first, transistor is electrically connected to a third node;

a control electrode of the second transistor is electrically connected to the first node, a first electrode of the second transistor is electrically connected to the third node, and a second electrode of the second transistor is electrically connected to the second node;

wherein the first reset compensation circuit is electrically connected to the first scanning signal terminal, a second scanning signal terminal, the first node, the second node, the third node and the second voltage signal terminal; and the first reset compensation circuit is configured to, under control of the first scanning signal and a second scanning signal received at the second scanning signal terminal, reset the pixel driving circuit and compensate for a threshold voltage of the second transistor;

the first reset compensation circuit includes a third transistor, a fourth transistor, a fifth transistor, a sixth transistor and a first capacitor;

a control electrode of the third transistor is electrically connected to the first scanning signal terminal, a first electrode of the third transistor is electrically connected to the second voltage signal terminal, and a second electrode of the third transistor is electrically connected to a fourth node;

a control electrode of the fourth transistor is electrically connected to the second scanning signal terminal, a first electrode of the fourth transistor is electrically connected to the third node, and a second electrode of the fourth transistor is electrically connected to a fifth node;

a control electrode of the fifth transistor is electrically connected to the second scanning signal terminal, a first electrode of the fifth transistor is electrically connected to the second node, and a second electrode of the fifth transistor is electrically connected to the fifth node;

a control electrode of the sixth transistor is electrically connected to the first scanning signal terminal, a first electrode of the sixth transistor is electrically connected to the fourth node, and a second electrode of the sixth transistor is electrically connected to the first node; and a first terminal of the first capacitor is electrically connected to the fourth node, and a second terminal of the first capacitor is electrically connected to the fifth node;

wherein the method comprises a data writing phase and a light-emitting phase, wherein in the data writing phase, in response to the first scanning signal received at the first scanning signal terminal, the data writing circuit is turned on to transmit the data signal received at the data signal terminal to the first node;

in the light-emitting phase, under the control of the voltage of the first node and the enable signal received at the enable signal terminal, the light-emitting control circuit is turned on to transmit the first voltage signal received at the first voltage signal terminal to the second node; and with the cooperation of the first voltage signal from the second node and the second voltage signal received at the second voltage signal terminal, the plurality of light-emitting portions in the light-emitting diode chip emit light in the different periods of time, or the at least two light-emitting portions emit light in the same period of time.

* * * * *

UNITED STATES PATENT AND TRADEMARK OFFICE
CERTIFICATE OF CORRECTION

PATENT NO. : 12,008,960 B2
APPLICATION NO. : 18/014254
DATED : June 11, 2024
INVENTOR(S) : Weixing Liu et al.

It is certified that error appears in the above-identified patent and that said Letters Patent is hereby corrected as shown below:

In the Specification

Column 30, Line 26:
"F-type transistors" should be "P-type transistors".

In the Claims

Column 34 (Claim 1), Line 29:
"second, transistor" should be "second transistor"

Column 37 (Claim 12), Line 34:
"The display substrate according to claim 9" should be "The display substrate according to claim 11"

Column 39 (Claim 16), Line 26:
"first, transistor" should be "first transistor"

Signed and Sealed this
Third Day of September, 2024

Katherine Kelly Vidal
*Director of the United States Patent and Trademark Office*